United States Patent [19]
Reed et al.

[11] Patent Number: 5,772,902
[45] Date of Patent: Jun. 30, 1998

[54] METHOD TO PREVENT ADHESION OF MICROMECHANICAL STRUCTURES

[75] Inventors: Michael L. Reed, Pittsburgh, Pa.; Takeshi Abe, Chiba, Japan

[73] Assignee: Carnegie Mellon University, Pittsburgh, Pa.

[21] Appl. No.: 630,263

[22] Filed: Apr. 10, 1996

Related U.S. Application Data

[62] Division of Ser. No. 379,174, Jan. 27, 1995.

[51] Int. Cl.⁶ .......................... H01L 21/302; B44C 1/22
[52] U.S. Cl. .................. 216/2; 216/11; 216/99; 156/657.1; 156/662.1; 437/225; 437/249
[58] Field of Search .................................. 216/2, 11, 39, 216/99; 156/662.1

[56] References Cited

U.S. PATENT DOCUMENTS

| | | | |
|---|---|---|---|
| 4,512,848 | 4/1985 | Deckman et al. | 156/630 |
| 4,674,180 | 6/1987 | Zavracky et al. | 29/622 |
| 5,166,612 | 11/1992 | Murdock | 324/207.13 |
| 5,192,395 | 3/1993 | Boysel et al. | 156/643 |
| 5,228,877 | 7/1993 | Allaway et al. | 445/24 |
| 5,282,924 | 2/1994 | Bayer et al. | 156/643 |
| 5,286,343 | 2/1994 | Hui | 156/647 |
| 5,316,619 | 5/1994 | Mastrangelo | 156/644 |
| 5,403,665 | 4/1995 | Alley et al. | 428/447 |

OTHER PUBLICATIONS

Legtenberg, Rob et al., "Stiction of Surface Micromachined Structures After Rinsing and Drying: Model and Investigation of Adhesion Mechanisms," Sensors and Actuators, A, vol. 43, pp. 230–238. 1994.

Alley, R.L. et al., "The Effect of Released–Etch Processing on Surface Microstructure Stiction," UC Berkeley, Dept. of Electrical Engineering and Computer Sciences, IEEE, 1992.

Kobayashi, Dai et al., "Photoresist–Assisted Release of Movable Microstructures," Jpn. J. Appl. Phys., vol. 32, Part 2, No. 11A, 1993.

Mastrangelo, C.H. et al., "A Dry Release Method Based on Polymer Columns for Microstructure Fabrication," Micro–Sensors & Actuators Department, IEEE, 1993.

Mastrangelo, C.H. et al., "Mechanical Stability and Adhesion of Microstructures Under Capillary Forces—Part II: Experiments," J. Microelectromechanical Systems, vol. 2, No. 1, 1993.

Dai Kobayashi et al., *Photoresist–Assisted Release of Movable Microstructures*, Jpn. J. Appl. Phys., vol. 32, (1993), Part 2, No. 11A, Nov. 1993.

Ted J. Hubbard et al., *Emergent Faces in Crystal Etching*, Journal of Microelectromechanical Systems, vol. 3, No. 1, March 1994.

Chang–Jin Kim et al., *Silicon–Processed Overhanging Microgripper*, Journal of Microelectromechanical Systems, vol. 1, No. 1, Mar. 1992.

H.H. Trieu et al., *Polyvinyl Alcohol Hydrogels I. Microscopic Structure by Freeze–etching and Critical Point Drying Techniques*, Colloid Polym Sci. 272: 301–309 (1994).

(List continued on next page.)

*Primary Examiner*—R. Bruce Breneman
*Assistant Examiner*—Michael E. Adjodha
*Attorney, Agent, or Firm*—Kirkpatrick & Lockhart LLP

[57] ABSTRACT

A method is provided for inhibiting stiction of suspended microstructures during post-release-etch rinsing and drying. The microstructures are shaped to include additional convex corners at regions of the released portion of the microstructure that can undergo substantial displacement toward the substrate. A stiction-inhibition method also includes incorporating clefts between the microstructure and adjacent field regions at regions of the microstructure which cannot undergo substantial displacement toward the substrate. Methods for inhibiting stiction are also provided wherein high-temperature rinse liquid is used and wherein a high-temperature anneal follows a rinsing step.

22 Claims, 19 Drawing Sheets

OTHER PUBLICATIONS

Chang–Jin Kim et al., *Polysilicon Microgripper*, Berkeley Sensor & Actuator Center An NSF/Industry/University Cooperative Research Center, University of California, IEEE (1990).

Dai Kobayashi et al., *An Integrated Lateral Tunneling Unit*, Micro Electro Mechanical System (1992).

Gary K. Fedder et al., *Thermal Assembly of Polysilicon Microstructures*, University of California at Berkeley Department of Electrical Engineering and Computer Sciences and the Electronics Research Laboratory Berkeley Sensor & Actuator Center, IEEE (1991).

N. Takeshima et al. *Electrostatic Parallelogram Actuators*, Institute of Industrial Science, The University of Tokyo.

Guckel et al. *Fabrication of Micromechanical Devices from Polysilicon Films with Smooth Surfaces*, Sensors and Actuators, vol. 20, pp. 117–122, (1989).

C.H. Mastrangelo et al., *A Dry–Release Method Based on Polymer Columns for Microstructure Fabrication*, Micro–Sensors & Actuators Department, IEEE, (1993).

R.L. Alley et al., *The Effect of Release–Etch Processing on Surface Microstructure Stiction*, University of California at Berkeley Department of Electrical Engineering and Computer Science, IEEE, (1992).

Rob Legtenberg et al., *Stiction of Surface Micromachined Structures After Rinsing and Drying: Model and Investigation of Adhesion Mechanisms*, Sensors and Actuators, A, vol. 43, pp. 230–238 (1994).

C.H. Mastrangelo et al., *Mechanical Stability and Adhesion of Microstructures Under Capillary Forces—Part I: Basic Theory*, Journal of Microelectromechanical Systems, vol. 2, No. 1, Mar. 1993.

C.H. Mastrangelo et al., *Mechanical Stability and Adhesion of Microstructures Under Capillary Forces—Part II: Experiments*, Journal of Microelectromechanical Systems, Vol 2, No. 1, Mar. 1993.

M. Orpana et al., *Control of Residual Stress of Polysilicon Thin Films by Heavy Doping in Surface Micromachining*, Semiconductor Laboratory, Technical Research Centre of Finland, IEEE, (1991).

FIG. 4a
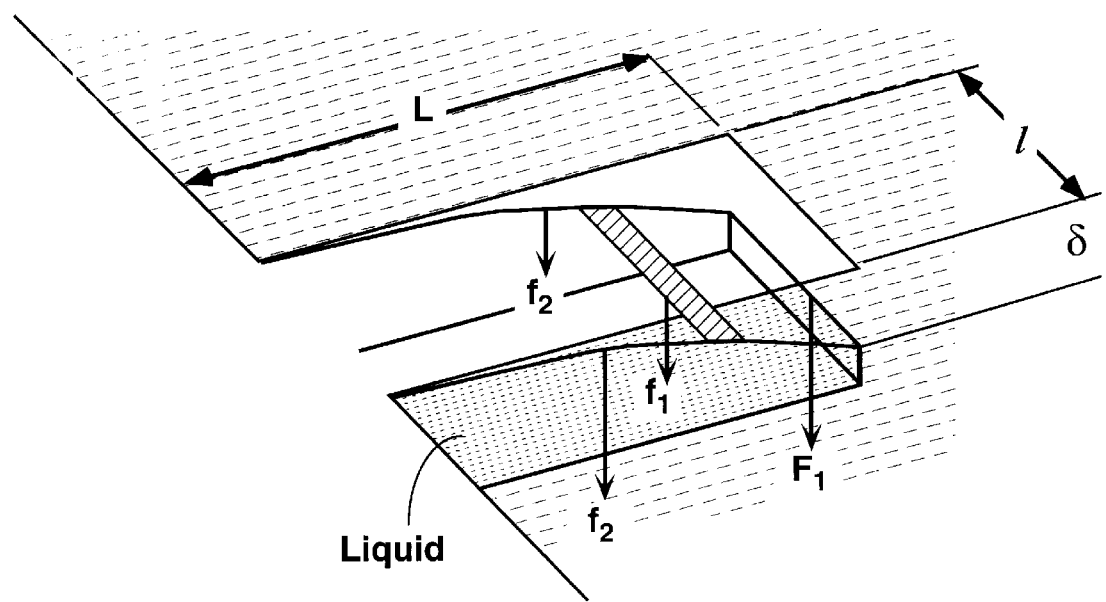
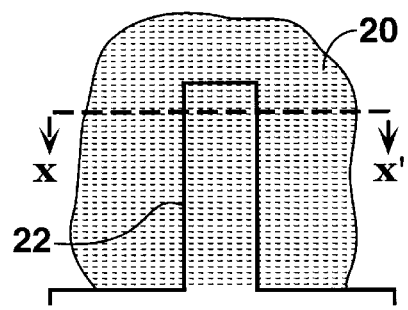
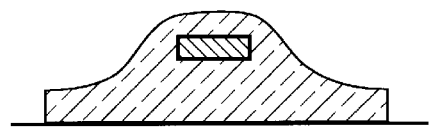
FIG. 5a  FIG. 5b

FIG. 6a
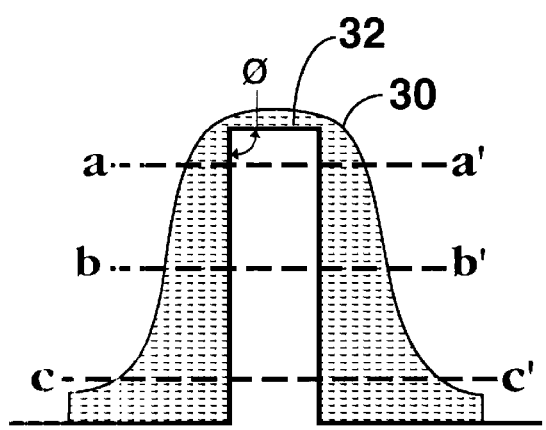
FIG. 6b
FIG. 6c
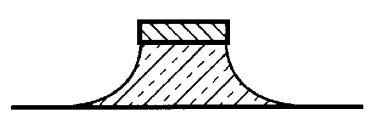
FIG. 6d
FIG. 6e
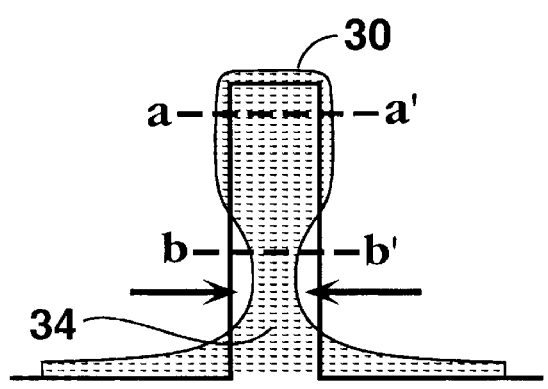
FIG. 6f
FIG. 6g
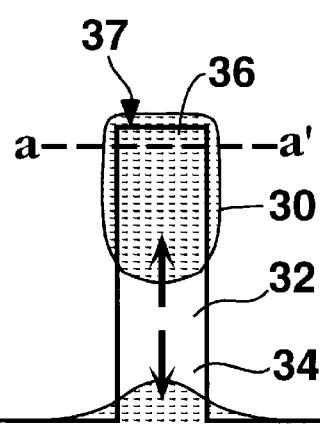
FIG. 6i
FIG. 6h

→ TIME

FIG. 9a  FIG. 9b  FIG. 9c
  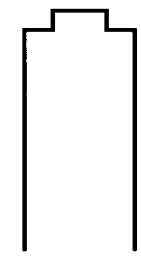  
FIG. 11
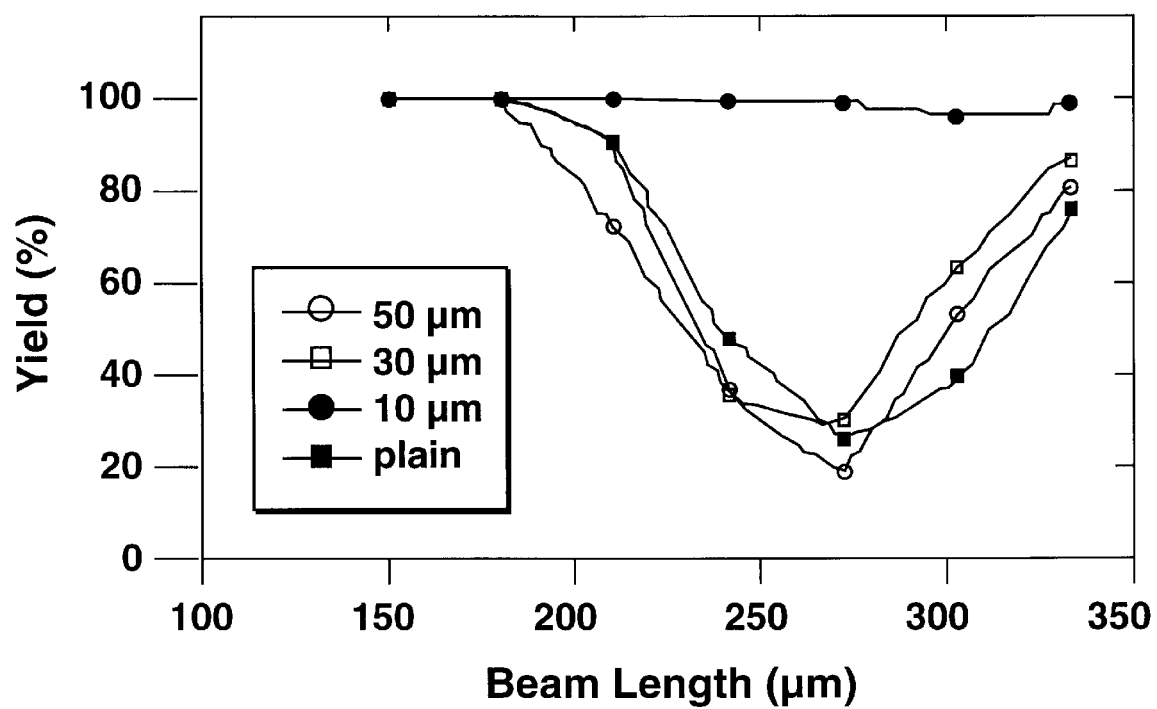

METHOD TO PREVENT ADHESION OF MICROMECHANICAL STRUCTURES

This is a divisional of copending application Ser. No. 08/379,174 filed on Jan. 27, 1995.

BACKGROUND OF THE INVENTION

1. Field of the Invention

The present invention relates to microelectromechanical ("MEM") structures and particularly relates to methods to inhibit adhesion of micromachined structures to a substrate (or to adjacent structures) after release etch processing. The present invention more particularly relates to methods to inhibit adhesion of MEM structures by providing a particular shape to the MEM structures or by incorporating a cleft between a portion of the MEM structures and adjacent field regions. The present invention also more particularly relates to elevated temperature post-release etch treatments that inhibit adhesion of MEM structures.

2. Description of the Invention Background

A common step in the fabrication of MEM structures, more generally referred to herein as "microstructures", is a wet etching step to release a portion of the structures from a substrate and create a "suspended" microstructure having a void or gap between the released portion of the microstructure and the substrate and one or more rigid base regions attached to the substrate. The released portion is typically a beam or plate having top and bottom surfaces which are suspended to be substantially parallel with the surface of the substrate. Common suspended MEM structures include cantilevered beams, double supported beams and plates suspended above a substrate by four supports. Devices which incorporate such suspended MEM structures include accelerometers, pressure sensors, flow sensors, transducers, microactuators, and electrostatic comb drives. As used herein, the term microstructure refers to a structure fabricated by MEM manufacturing techniques, which include photolithography, thin film deposition, bulk micromachining, surface micromachining, and etching.

The release etch can be an anisotropic etch to either produce a cavity in the substrate ("bulk micromachining") or remove a sacrificial layer intermediate a portion of the microstructure and the substrate ("surface micromachining"). In both micromachining processes, the released portion of the microstructures often permanently adhere to the substrate or adjacent structures after post-etch rinsing and drying procedures and this reduces the micromachining process yield. The microstructure adhesion phenomenon is known as stiction and is referred to herein by that term. The significance of stiction has increased as more compliant MEM structures have been designed and fabricated.

Although stiction can occur between a microstructure and a substrate or any adjacent structure, for purposes of simplification, the present specification only refers to stiction occurring between a microstructure and a substrate. It is to be understood that the following discussion is equally applicable to stiction which may occur between a microstructure and an adjacent non-substrate structure, for example, an adjacent microstructure. It is believed that the inventions described herein are equally useful for preventing stiction between the released portion of suspended microstructures and adjacent non-substrate structures.

The mechanism by which stiction occurs remains a matter of dispute, but can be divided into two stages: (a) mechanical collapse of the released portion of the microstructure to contact or move very close to the substrate and (b) adhesion of the released portion of the microstructure to the substrate. It is believed that the microstructure's mechanical collapse is initiated by high surface tension forces resulting from etchant rinse liquid trapped in the capillary-like spaces between the microstructure and the substrate. Several mechanisms have been proposed to explain the adhesion of the microstructure to the substrate, including solid bridging, liquid bridging, Van der Waals forces, and hydrogen bridging. See R. L. Alley et al., *Proc. IEEE Solid-State Sensor & Actuator Workshop*, Hilton Head Island, S.C., pp. 202–207 (1992); R. Legtenberg et al., "Stiction of Surface Micromachined Structures After Rinsing and Drying: Model and Investigation of Adhesion Mechanisms", *Sensors and Actuators A*, 43 (1994) pp. 230–238. Mastrangelo and Hsu provide a detailed discussion of the adhesion of suspended surface micromachined structures in the papers "Mechanical Stability and Adhesion of Microstructures Under Capillary Forces—Part I: Basic Theory" and "Mechanical Stability and Adhesion of Microstructures Under Capillary Forces—Part II: Experiments", J. of Microelectromechanical Systems, Vol. 2, No. 1 (March 1993), pp. 33–55, both of which are hereby incorporated herein by reference.

A number of techniques have been developed to avoid stiction. One technique is to reduce the real contact area between the released portion of the microstructure and the underlying substrate either through nanoscale roughness intrinsic to one or both surfaces or through the formation of microscale standoff bumps or "dimples" on the microstructure. Reducing the real contact area between the microstructure and the substrate weakens adhesive forces therebetween and reduces the likelihood that the microstructure will permanently adhere to the substrate.

Another group of stiction inhibition techniques eliminates the source of surface tension between the released portion of microstructure and the substrate and prevents the microstructure's initial collapse by eliminating the gas-liquid interface. In one such technique, the etchant rinse liquid is solidified and then removed by sublimation. D. Kobyashi et al., *Proc. IEEE Micro Electro Mechanical Systems, Travemunde, Germany* 1992 (IEEE, New York, 1992) p. 214; N. Takeshima et al., *Proc. Int. Conf. Solid-State Sensors & Actuators (Transducers '91)*, San Francisco, Calif., 1991 (IEEE, New York, 1991) p. 198; H. Guckel et al., "Fabrication of Micromechanical Devices from Polysilicon Films With Smooth Surfaces", *Sensors & Actuators*, 20 (1989) p. 117–22. In an alternate procedure, using a pressure-controlled and temperature-controlled chamber, the rinse liquid is evacuated in its supercritical state, wherein the gas-liquid distinction does not exist. G. T. Mulhern et al., *Proc. Int. Conf. Solid State Sensors & Actuators (Transducers '93)*, Yokohama, 1993 (IEEJ, Tokyo, 1993) p. 296.

Techniques have also been developed that utilize temporary support structures to mechanically reinforce the released portion of the microstructure and retain the desired microstructure/substrate gap during wet etching, rinsing and drying. One method employs tethers which are broken after fabrication of the microstructure. See K. Minami et al., *Proc. Micro Electro Mechanical Systems*, Fort Lauderdale, Fla., 1993 (IEEE, New York, 1993) p. 53. In an alternate method, temporary supports are incorporated into the microstructure and are subsequently removed; after release etching and rinsing, the rinse liquid is replaced with a photoresist and acetone mixture which is dried and supports the microstructure above the substrate during rinse liquid drying. The support structures are subsequently ashed in oxygen plasma.

See M. Orpana et al., "Control of Residual Stress of Polysilicon Thin Films By Heavy Doping In Surface Micromachining", *Proc. Int. Conf. Solid-State Sensors & Actuators* (*Transducers* '91), San Francisco, Calif., 1991 (IEEE, New York, 1991) p. 957–60. A third alternative procedure utilizing temporary columns is the subject of U.S. Pat. No. 5,258,097 to Mastrangelo and utilizes an array of discrete microscopic polymer columns, preferably of xylylene, which provide additional mechanical support to surface micromachined structures during the sacrificial etch to prevent collapse of the microstructures. The polymer columns are removed after the rising and drying steps by oxygen plasma etching. See also C. H. Mastrangelo et al., "A Dry-Release Method Based on Polymer Columns for Microstructure Fabrication", *Proc. IEEE Micro Electro Mechanical Systems*, Fort Lauderdale, Fla., 1993, (IEEE, New York, 1993) pp. 77–81.

Each of the above methods for inhibiting stiction has significant drawbacks. All of the above methods suffer from yield loss, are process-oriented, and incorporate additional steps into the microstructure fabrication process, thereby increasing the complexity and cost of fabrication. Both the sublimation and supercritical drying methods require specialized equipment to dry the rinse liquid as compared with conventional fabrication techniques wherein the rinse liquid is evaporated at ambient (i.e., room) temperature. Both the dimple method and each of the above temporary support methods require additional fabrication steps prior to the rinse liquid drying step, thereby significantly increasing microstructure fabrication time and adding considerable additional cost per microstructure. In particular, in the temporary support method utilizing a photoresist/acetone mixture, because the microstructures have already been released from the substrate when the rinse liquid is replaced by the mixture, the mixture must be added very carefully to avoid damaging the microstructures, especially if the microstructures are relatively complaint. Also, several fabrication steps, including an additional masking step, are necessary to form the polymer columns of the method of U.S. Pat. No. 5,258,097, and a final plasma etching step must be used to remove the polymer columns and free the microstructure.

An additional disadvantage of both the temporary support methods and the gas-liquid interface elimination methods is that those methods may only reduce stiction during microstructure fabrication and the methods do not inhibit stiction that can occur after fabrication when the microstructure is subjected to environments including liquid or liquid vapor. Also, none of the above methods prevent the build-up of residue at positions on the microstructure where stiction may occur.

It is apparent from the aforementioned disadvantages of the known methods that a need exists for a method of inhibiting stiction of suspended microstructures that does not significantly increase the complexity of conventional MEM structure fabrication techniques, can be carried out without specialized equipment, and does not significantly add to the cost of or time required for fabrication.

SUMMARY OF THE INVENTION

To address the disadvantages of the existing means to avoid stiction discussed above, the inventors have determined through theoretical and experimental investigations of the drying mode of etchant rinse liquid from suspended micromachined structures that certain modifications to the shape of the microstructures will inhibit stiction. Modifications to microstructure shape were found to either affect the drying mode of etchant rinse liquids or reduce the area of possible contact between the released portion of the microstructure and the substrate. The inventors have determined that certain appropriately-placed shape modifications can promote a rinse liquid drying mode whereby collapse and/or adhesion of the microstructure does not occur.

In particular, the present invention provides for modifying the edge surfaces of the released portion of suspended microstructures to include at least one additional convex edge. The suspended microstructures include one or more base portions attached to a substrate, and a released portion which is suspended above the substrate and includes at least top and bottom surfaces. The edge surfaces of the released portion of the microstructure are defined as the surfaces extending between the top and bottom surfaces of the released portion. The additional convex edge can be added by modifying the edge surface to include (i) an additional structure which extends from the released portion or (ii) a void. To inhibit stiction of the released portion, the edge surface modification is disposed at a region of the released portion that can undergo substantial displacement toward the substrate.

The inventors have also found that stiction can be inhibited by etching the substrate to include at least one cleft defined by the substrate and an edge of the relatively rigid region of the microstructure's released portion adjacent the nicrostructure's base portion. Such clefts are referred to herein as "substrate/microstructure clefts". The relatively rigid region is a region which cannot undergo substantial displacement toward the substrate. It is believed that the substrate/microstructure clefts prevent rinse liquid from moving under and pinching off at the relatively rigid regions and thereby avoid the formation of isolated rinse liquid droplets at microstructure regions which can undergo substantial displacement toward, and adhere to, the substrate.

The present inventions relating to the incorporation of either convex corners or substrate/microstructure clefts only require certain changes in the pre-etch masking of the microstructure, do not require additional equipment and, unlike the incorporation of dimples and temporary supports, do not require complex or time-consuming modifications to the fabrication process. Also, the convex corner and substrate/microstructure cleft inventions can be used to inhibit stiction after microstructure fabrication when the microstructure is subjected to environments including liquids or liquid vapor. Moreover, the present inventions relating to the incorporation of convex corners and substrate/microstructure clefts inhibit the build up of liquid residue (both during and after fabrication) at positions on the microstructure where stiction might occur; instead, liquid residue will build-up at innocuous positions on the microstructure which do not result in stiction.

The inventors have also discovered that stiction can be inhibited using certain high-temperature post-etch rinsing, and drying procedures. The surface tension acting to collapse liberated microstructures only weakly depends on temperature and would not be expected to lessen significantly with increasing temperature. Unexpectedly, the present high-temperature procedures significantly reduce stiction. The inventors believe that the significant reduction in stiction provided by the present invention's high-temperature procedures may occur, in part, because rinse liquids under tension transition from a metastable state to an unstable state at the high temperatures.

In particular, the present invention provides a stiction-inhibiting method for rinsing a microstructure including a base portion attached to a substrate and a released portion suspended above the substrate, wherein the rinse liquid is at a temperature greater than ambient temperature, and preferably at the liquid's boiling temperature. The step of rinsing the microstructure in deionized water at ambient temperature may precede the high-temperature rinsing step. The present invention also provides a method for rinsing and drying microstructures having a base portion attached to a substrate and a released portion suspended above the substrate, which includes first rinsing the microstructure in a liquid and then subjecting the microstructure to a temperature greater than ambient temperature to thereby increase evaporation of the rinse liquid from the microstructure. Preferably, the microstructure is subjected to a temperature above the rinse liquid's critical point temperature. More preferably, the microstructure is rapidly heated to a temperature above the rinse liquid's critical point temperature by heating the rinsed microstructure in a rapid thermal annealer.

As with the present stiction-inhibiting methods including modification's to microstructure shape, the present high-temperature rinsing and drying methods do not require complicated, time-consuming, or expensive modifications to the fabrication process. These and other advantages of the present invention will be apparent from the following detailed description of the invention.

BRIEF DESCRIPTION OF THE DRAWINGS

FIG. 4a is a schematic illustration of the forces generated by a trapped liquid droplet pulling a micromachined cantilevered beam toward a substrate;

FIGS. 5a–5i are a sequential illustration of the rigid beam drying mode for a cantilevered beam and wherein: FIGS. 5a and 5c are top views of the cantilevered beam; FIG. 5b is a cross-sectional view through the cantilevered beam of FIG. 5a along line x–x'; FIG. 5d is a cross-sectional view through the cantilevered beam of FIG. 5c along line y–y'; FIG. 5e and 5h are top views of the cantilevered beam and also show the position of the liquid beneath the beam; FIG. 5f is a cross-sectional view through the cantilevered beam of FIG. 5e along line a–a'; FIG. 5g is a cross-sectional view through the longitudinal axis of the tip portion of the beam of FIG. 5e along line b'–b; and FIG. 5i is a cross-sectional view through the cantilevered beam of FIG. 5h along line c–c';

FIGS. 6a–6i are a sequential illustration of the bending beam drying mode for a cantilevered beam and wherein: FIG. 6a is a top view of the cantilevered beam, including top and cross-sectional views; FIGS. 6b, 6c and 6d are cross-sectional views through the cantilevered beam of FIG. 6a along the lines a–a', b–b' and c–c', respectively; FIG. 6e and 6h are top views of the cantilevered beam and also show the position of the liquid beneath the beam; FIGS. 6f and 6g are cross-sectional views of the cantilevered beam of FIG. 6e along lines a–a' and b–b', respectively; and FIG. 6i is a cross-sectional view through the cantilevered beam of FIG. 6h along line a–a';

FIG. 9a–9c are representations of the mask patterns (not to scale) used to create the cantilevered beams in Example 1;

FIG. 11 is a plot of release yield as a function of beam length for bulk micromachined cantilevered beams fabricated by Example 1;

DETAILED DESCRIPTION OF THE PREFERRED EMBODIMENT

To explore the stiction mechanism, the inventors undertook theoretical and experimental investigations of the dynamics of drying rinse liquids during the fabrication of suspended microstructures. The inventors' theoretical explanation of the drying process is set out below and their experimental investigations follow.

Although the inventors' theoretical explanation of the rinse liquid drying process played some part in the development of the inventions described herein, it is to be understood that the following theoretical discussions represent the inventors' current understanding and that the utility of the inventions described herein neither depends on, nor is limited by, the accuracy of the inventors' theoretical understanding.

Theoretical Investigation of the Drying Process

I. The Forces Involved in the Drying Process

The total energy of a system comprising a micromachined beam suspended above a substrate during the rinse liquid drying process can be expressed as the sum of the surface energy of the liquid and the stored elastic energy in the beam (Equation 1):

$$U = \gamma A + U_e \quad (1)$$

wherein U is the total energy of the system, $\gamma$ is the liquid-gas surface tension, A is the droplet surface area, and $U_e$ is the elastic energy stored in the beam. As the liquid dries, the droplet decreases in size and A in Equation 1 decreases. The drying process will proceed so as to continually lower U; this means that the elastic energy cannot increase faster than the decrease in surface energy.

Figure 1:
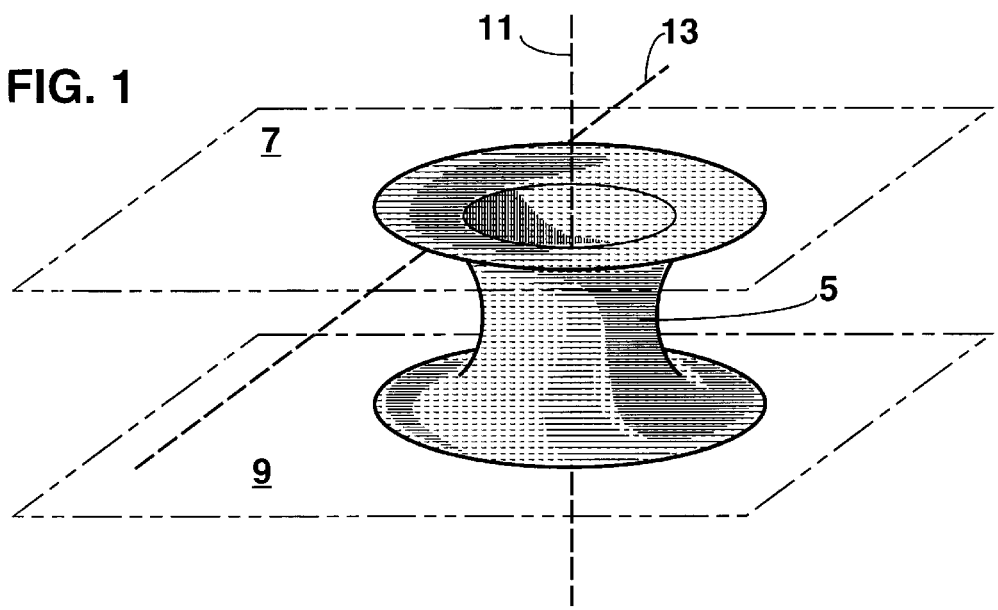
FIG. 1 is a representation of a curved meniscus formed between opposed surfaces.

Two forces are associated with the liquid. The first force is the surface tension force per unit length, denoted $\gamma$. The second force arises when the rinse liquid meniscus is curved. FIG. 1 illustrates a curved meniscus 5 formed between surfaces 7 and 9, wherein vertical and horizontal axes are represented as 11 and 13, respectively. When liquid surfaces form curved menisci as shown in FIG. 1, there exists a pressure difference $\Delta P$ at the liquid/gas boundary that is given by the Laplace equation (Equation 2) as follows:

$$\Delta P = \gamma \left( \frac{1}{r_\parallel} + \frac{1}{r_\perp} \right) \quad (2)$$

where $\Delta P$ is the Laplace pressure (defined as the internal pressure less the external pressure) and $r_\parallel$ and $r_\perp$ are the two radii of curvature of the liquid surface. The radii of curvature $r_\parallel$ and $r_\perp$, respectively, are the radii of two circles drawn tangent to the surface of the meniscus about axes parallel or perpendicular to the plane of the substrate. Thus, The Laplace pressure $\Delta P$ is not only a function of $r_\parallel$, which is related to the gap between the microstructure and the substrate, but also $r_\perp$, which is strongly related to the shape of the microstructure's periphery.

Assuming the drying process is a quasi-static process (i.e., the drying process proceeds slowly relative to the speed of sound in liquids), the pressure inside a liquid droplet is the same everywhere. This state of constant pressure is referred to herein as the "isobaric principle". If isobaric principle was not satisfied, pressure differences within the liquid droplet would cause the liquid to quickly flow and thereby contradict the quasi-static assumption. The quasi-static assumption implies that the average radii of curvature of the meniscus is a constant at all points on the liquid's surface, regardless of the shape of the microstructure to be released from the substrate.

Figure 2A:
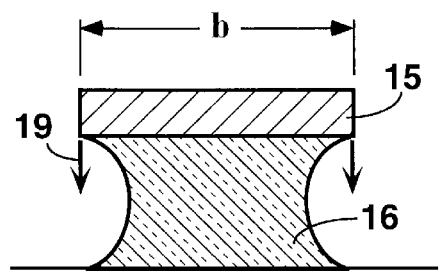
FIGS. 2a and 2b, respectively, are schematic cross-sectional views illustrating inside and outside menisci formed between a micromachined beam of width b suspended above a substrate.
Figure 2B:
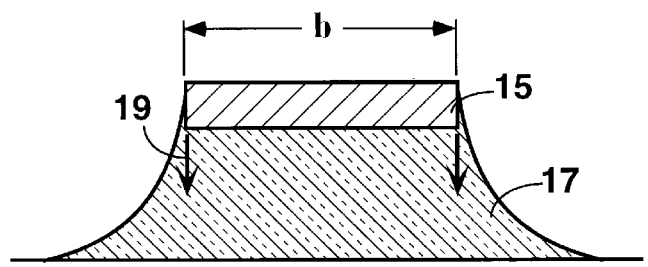

FIGS. 2a and 2b indicate the forces acting on a beam microstructure 15 having width b, which is separated by a gap from a substrate in the presence of liquid. The long axis of the beam is oriented out of the page, $r_\parallel$ is the radius of curvature of the menisci 16 and 17, and $\gamma$ is the liquid surface tension. The menisci of FIGS. 2a and 2b make an angle $\theta$ with vertical axis 19 at the point where the menisci join the beam. For purposes of this discussion, the meniscus angle $\theta$ is defined as the angle formed between the vertical axis 19, and a plane tangent to the meniscus where it meets the beam. FIGS. 2a and 2b also illustrate two possible liquid droplet configurations. FIG. 2a depicts an "inside" meniscus wherein the droplet is completely contained under the beam. FIG. 2b depicts an "outside" meniscus wherein the liquid attaches to the sides of the beam.

Because the edges of a beam are convex corners, it is possible for the meniscus to meet the microstructure over a range of angles, even though the contact angle is largely a function of the material system. The surface tension force $\gamma$ must therefore be multiplied by a cosine $\theta$ term to determine the component acting in the direction of the beam restoring force.

In the case of silicon micromachined structures, the contact angle between the solid surfaces and the meniscus is generally very shallow, and is often approximated as zero. However, the meniscus can make this shallow angle with either the bottom of the beam, as in FIG. 2a, or the sides of the beam, as in FIG. 2b. If the inside meniscus structure is formed, then the vertical component of the surface tension force will be negligible and only the Laplace pressure force is significant. If the droplet assumes the outside meniscus form, then the surface tension force acts in the same direction as the beam restoring force and must be included. In either of the configurations depicted in FIGS. 2a and 2b, the Laplace pressure is generally considered the dominant force acting on microstructures during the rinse liquid drying process.

The formation of outside menisci allows liquid droplets to form menisci at different microstructure/substrate gap distances during the drying process without violating the isobaric principle. In addition, the surface tension forces are often not negligible in the drying process, especially in narrow microstructures where the width of the microstructure is the same order as the gap distance. This is because the Laplace pressure force is a function of the microstructure area, whereas the surface tension force depends on the lineal perimeter of the microstructure.

Figure 3:
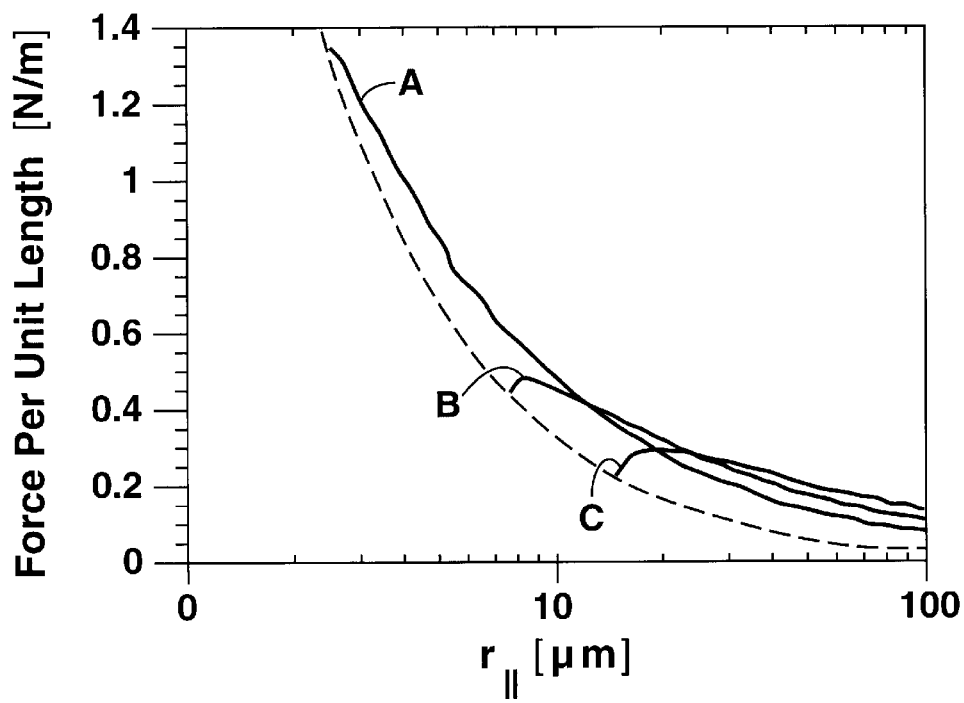
FIG. 3 is a plot of fluid forces per unit length acting on a 44 μm-wide beam as a function of radius of curvature for water at 20° C. and at beam/substrate gap distances of 5, 15 and 30 μm.

FIG. 3 shows calculated Laplace pressure and surface tension forces per unit length (calculated in N/m for water at 20° C.) acting on a 44 $\mu$m-wide cantilevered beam as a function of meniscus radius of curvature ($r_\parallel$) for various beam/substrate gap distances. Solid lines A, B and C correspond to surface tensions at gap distances of 5, 15 and 30 $\mu$m, respectively. The dotted line corresponds to the Laplace pressure and is independent of gap distance. For large gap distances (greater than half the beam width) the total force near the maximum is dominated by the surface tension forces rather than the Laplace pressure force. Because the fluid force is a maximum at the transition between outside and inside menisci, the inventors have determined that menisci tend to exist as outside menisci as long as possible before their transition to inside menisci.

Relying on the foregoing description of the forces acting on suspended microstructures during the drying process, the inventors provide the following mathematical model of the drying process.

II. Model of the Drying Process

The maximum displacement of micromachined cantilevered beams in the direction of the substrate during the initial stages of the drying process, i.e., before inside menisci have formed, were estimated using a model including both the Laplace pressure and surface tension forces. It was found that the value of the maximum displacement influences the drying mode of the beams.

The three exposed edges of a cantilevered beam result in surface tension and a Laplace pressure which exert downward forces on the beam. These downward forces may be represented by the following Equations 3–5:

$$F_1 = \gamma b \cos\theta \quad (3)$$

$$f_2 = \gamma \cos\theta \quad (4)$$

$$f_1 = \frac{\gamma b}{d} \quad (5)$$

wherein $F_1$ is the concentrated force at the beam tip due to surface tension, $f_2$ is the distributed force (per unit length) due to surface tension along each edge of the beam, $f_1$ is the distributed force (per unit length) due to the Laplace pressure, and d is the maximum separation between the beam and the substrate (the cavity depth for bulk micromachined beams). The denominator in Equation 5 is the meniscus radius $r_{\parallel}$, which equals d because the meniscus cross-section at the base is a 90° arc. Although, strictly speaking, Equations 3 and 4 should include the dependence of θ on gap distance as the beam bends, disregarding this bending factor was ignored because it considerably simplifies the calculation and results in a maximum error of less than 8% of the force.

Using standard cantilevered beam theory, the vertical displacement δ of the beam tip during the initial stages of the drying process can be expressed by Equation 6, which is the summation of the vertical displacements $\delta(F_1)$ and $\delta(2f_2+f_1)$ due to each of the downward force components:

$$\delta = \delta(F_1) + \delta(2f_2 + f_1) = \frac{\gamma b L^3}{3EI} + \frac{\gamma\left(2 + \frac{b}{d}\right)L^4}{8EI} \quad (6)$$

Figure 4B:
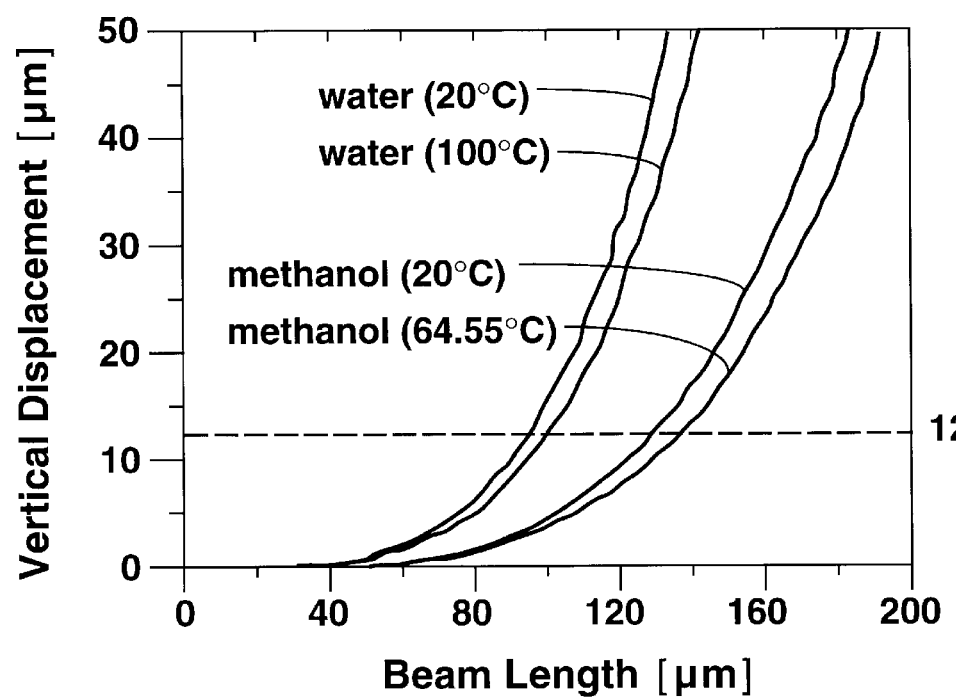
FIG. 4b is a plot of calculated maximum displacement of a micromachined cantilevered beam (1 μm thick, 44 μm wide, Young's modulus of $7.15 \times 10^{10}$ N/m$^2$) as a function of beam length for water and methanol at both 20° C. and their boiling points.

FIGS. 4a and 4b provide a schematic model and an estimated displacement for a cantilevered beam microstructure subjected to water and methanol rinse liquids. As shown in FIG. 4a, the beam is pulled downward in the direction of the substrate by the surface tension forces $f_1$ and $f_2$, and by the Laplace pressure force $F_1$. Taking into account the forces acting on the cantilevered beam, FIG. 4b plots the maximum vertical displacement of the tip of a beam (1 μm thick, 44 μm wide, and with a Young's modulus of $7.15\times10^{10}$ N/m²) in the direction of the substrate as a function of beam length for both water and methanol at 20° C. and their boiling points. Because it has a smaller surface tension constant, methanol yields much smaller displacements than water. Raising the rinse liquid temperature to the boiling point, which decreases surface tension somewhat, appears to have only a minor effect on beam displacement using both liquids. Beams which deflect less than a certain amount and do not closely approach or contact the substrate, will not adhere to the substrate.

Also show in FIG. 4b is the critical displacement value of 12.2 μm which the inventors have found is necessary for adhesion to occur; in light of the 12.2 μm critical value, cantilever beams less than 95 μm long (in 20° C. water) or 120 μm long (in 20° C. methanol) will not stick to the substrate. (These critical beam length values are in close agreement with experimental microstructure yields achieved by the inventors, plotted as line A in FIG. 30 and line B in FIG. 31, discussed below, in which the release yield was nearly 100% for beams shorter than the critical values and declined for longer beams).

The drying model developed above holds as long as the corners can be neglected; the situation is more complicated once the drying proceeds and liquid is removed from the beam to the point where an inside meniscus forms. The inventors have determined that the rinse liquid dries via two distinct modes, depending on the beam rigidity: (i) a "rigid beam" or "short beam" drying mode and (ii) a "bending beam" or "long beam" drying mode. The inventors have also determined that it is the particular drying mode that influences whether stiction will occur. Following is a description of the two drying modes, as well as an explanation of the modes based on the above theoretical discussion.

A. Rigid Beam Drying Mode

FIGS. 5a–5i illustrates the drying process determined by the inventors for a relatively rigid micromachined cantilevered beam 22 wherein the gap distance between the beam 22 and the substrate is relatively uniform throughout the drying process. In the rigid beam drying mode depicted in FIGS. 5a–5i, the rinse liquid 20 is first forced underneath the beam 22 at the beam tip's sharp convex corners and drying proceeds from the beam tip to base. Because the liquid evaporates from the beam tip to base, the beam tip is not forced into contact with the substrate as the rinse liquid dries and this prevents adhesion of the beam tip to the substrate.

Figure 5C:
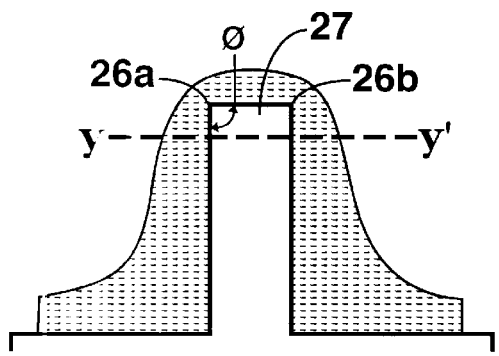
Figure 5D:
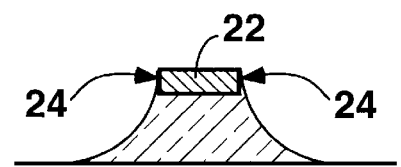
Figure 5E:
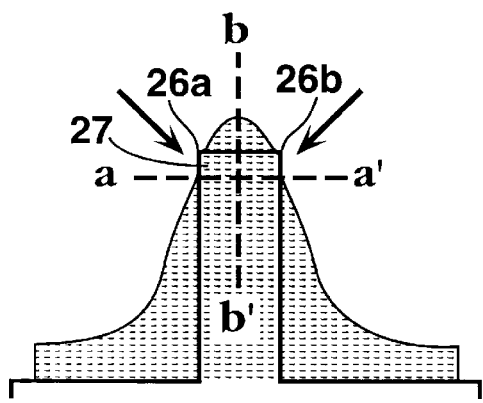
Figure 5F:
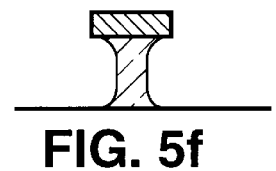
Figure 5G:
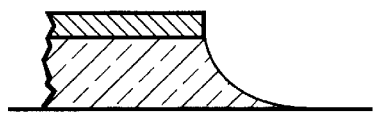
Figure 5H:
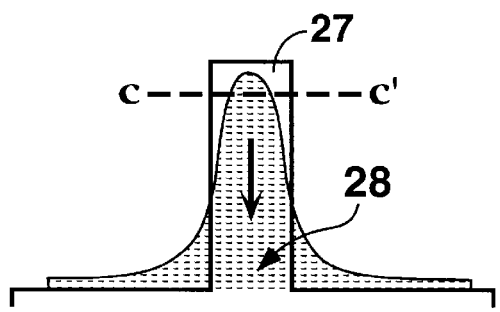
Figure 5I:

FIGS. 5a–5i show top views and certain cross-sectional views, as indicated, of the beam. With rinse liquid 20 fully surrounding beam 22 (FIGS. 5a and 5b), $r_\perp$ approaches infinity along the edges parallel to the axis of the beam. Because the pressure everywhere inside the droplet is constant, the Laplace pressure is given by $\gamma/r_{\parallel}$. As the liquid evaporates from fully surrounding the beam (FIGS. 5a and 5b), the surfaces of the droplet eventually attach to the side surfaces 24 of the beam 22 to form an outside meniscus (FIGS. 5c and 5d). As indicated in FIG. 5c, the beam tip 27 includes two sharp convex corners 26a and 26b, which produce small positive values of $r_\perp$. Because the droplet is isobaric, this forces the other radius $r_{\parallel}$ to compensate by becoming, locally, much less negative. As illustrated in FIGS. 5e–5g, this smaller absolute value of $r_{\parallel}$ causes the liquid 20 as it evaporates to first be pushed underneath the beam 22 at the convex corners 26a and 26b to form an inside meniscus in the vicinity of the corners. At the same time, the shape of the droplet sharpens as viewed from above, which causes the liquid 20 at the tip 27 to move underneath the beam 22 as well. When the edge of the droplet at the tip 27 is fully underneath the beam 22, the meniscus will quickly move towards the fixed base 28 of the beam, driven by a slight pressure gradient. The pressure gradient results because once an inside meniscus forms, the radius $r_{\parallel}$ is equal to $-(d/2)$ everywhere and the tip, with a finite $r_\perp$, is therefore at a higher pressure than other parts of the droplet, where $r_\perp$ approaches infinity.

B. Bending Beam Drying Mode

The inventors have determined that a different drying process, illustrated sequentially in FIGS. 6a–6i, occurs for beams which significantly bend toward the substrate from the above-discussed surface tension and Laplace pressure forces. Whether a beam's bending propensity is sufficient to produce the bending beam drying mode depends on the stiffness of the beam and on the length of the beam. In the bending beam drying mode, an isolated droplet forms at the beam's tip region and the evaporation of the isolated droplet progress toward the beam tip and urges the beam tip into contact or close proximity with the substrate. When the beam tip either closely approaches or contacts the substrate, the tip may adhere to the substrate and stiction occurs.

FIGS. 6a–6i provide a top view and one or more cross-sectional views, as indicated. When liquid 30 attaches to a long and therefore flexible beam 32, the gap between the beam and substrate is a function of position; as shown by the cross-sectional views along a–a', b–b' and c–c' in FIG. 6a, the gap is smaller near the tip than near the base. Along the beam perimeter, where $r_\perp$ approaches infinity, the radius $r_{\parallel}$ is constant because the droplet pressure is constant. As the liquid dries, the decrease in surface area drives the absolute value of $r_\parallel$ to smaller values and the droplet will first form an inside meniscus near the beam base 34 (FIGS. 6e–6g) where the gap is larger. The initiation of an inside meniscus near the base 34 is corroborated by FIG. 3, which shows that for a given change in $r_\parallel$, a smaller increase or even a decrease in total force will occur at larger gap distances. Therefore, energy minimization favors the droplet moving underneath the beam to form an inside meniscus near the base, where the gap between the beam and the substrate is larger.

The preferential formation of an inside meniscus near the beam base 34 forces the droplet to neck down in this region, which in turn results in a negative value of $r_\perp$ because the meniscus assumes a concave curvature as viewed from above. The necking continues, resulting in less negative (smaller radius) values of $r_\perp$, until the two menisci on either side of the beam 32 meet and pinch off a separated droplet at the beam tip 36 (FIGS. 6h and 6i). At the point where the two menisci meet, $r_\perp$ is an extremely small positive quantity and a non-steady-state pressure difference exists between the base 34 and tip 36, with the droplet region near the tip free end 37 of the 36 at a lower pressure. This pressure gradient causes the drying to quickly proceed from the point of separation of the isolated droplet toward the tip 36, as indicated by the arrows in FIG. 6h.

The foregoing description of bending beam drying ignores the effects of the beam's convex corners near the tip, key in the rigid beam drying mode. However, although the convex corners lower $r_\perp$ locally, the meniscus does not move underneath the beam at the tip because the gap is too small for this to occur.

The inventors' conclusions, experimental results and prophetic examples of the inventions follow.

Conclusions and Experimental Procedures
I. Stiction Reduction By Convex Corners

The inventors have found that the formation of isolated droplets of rinse liquid at the tip of a beam in the bending beam drying mode promotes stiction of the microstructure because the forcing of the beam tip into close proximity or contact with the substrate as the droplet evaporates increases the occurrence of adhesion of the microstructure tip to the substrate. The inventors have also found that in doubly clamped beams, where the center region of the beam may undergo substantial displacement toward the substrate, the initiation of inside menisci near the beam bases, where the gap between the beam and the substrate is largest, causes the formation of an isolated droplet of rinse liquid at the center portion of the beam as the rinse liquid evaporates inward from the beam bases to the beam in a bending-beam-type drying mode. This drying mode promotes stiction of the doubly clamped beam because the beam center is forced into close proximity or contact with the substrate as the isolated droplet evaporates and the surface tension and Laplace pressure forces associated the droplet pull the beam downward, much the same as the isolated droplet associated with a cantilever beam tip. Thus, the inventors have discovered that promotion of a rigid beam drying mode wherein the rinse liquid dries toward the microstructure base or bases from regions of the released portion of the microstructure which can undergo substantial displacement in the direction of the substrate (for example, the beam tip of a cantilevered beam and the center region of a doubly clamped beam) will reduce the occurrence of stiction because the substantially displaceable region is not forced into contact or close proximity with the substrate. For purposes of the invention, displacement of the released portion of a microstructure is "substantial" if the displacement in the direction of the substrate is sufficient to allow the released portion to adhere to the substrate.

It is believed that the drying behavior of rinse liquid in contact with cantilever and doubly clamped beams can be applied to multiply-supported, suspended microstructures. For example, it is believed that stiction of a micromachined plate suspended above a substrate by three or more base portions attached to the substrate can also be prevented by initiating a drying mode wherein rinse liquid evaporates or migrates toward the base portions and away from the regions of the released portion of the microstructure which can undergo substantial displacement toward the substrate. Prophetic examples of multiply-supported microstructures incorporating means to promote such a rigid-beam-type drying mode are provided below in the experimental section. The inventors have discovered that modifying the shape of suspended microstructures to include additional convex corners at regions which can undergo substantial displacement in the direction of the substrate can initiate the rigid beam mode of etchant rinse liquid drying wherein the rinse liquid evaporates toward the rigid base portions of the microstructure from regions including the additional convex corners.

Figure 7A:
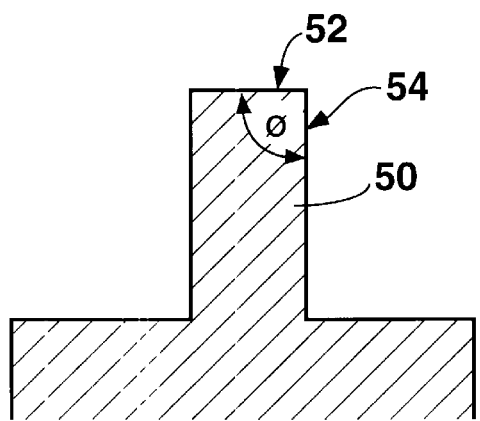
FIGS. 7a–7e illustrate convex corners created by the stiction-inhibiting method of the present invention.
Figure 7B:
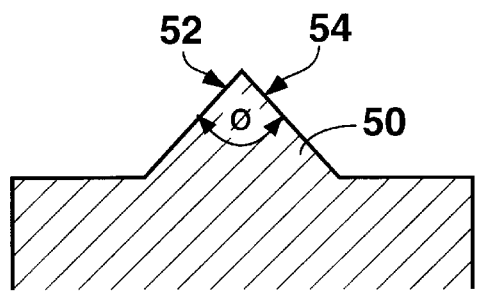
Figure 7C:
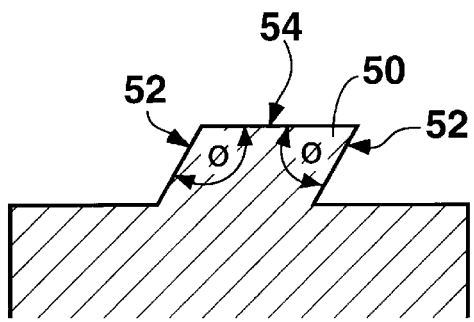
Figure 7D:
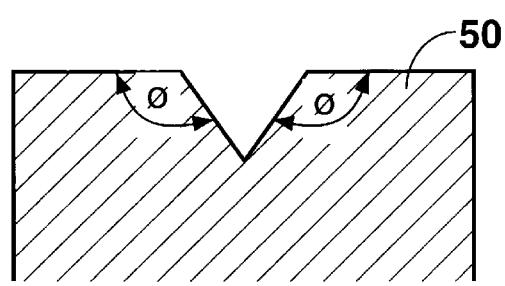
Figure 7E:
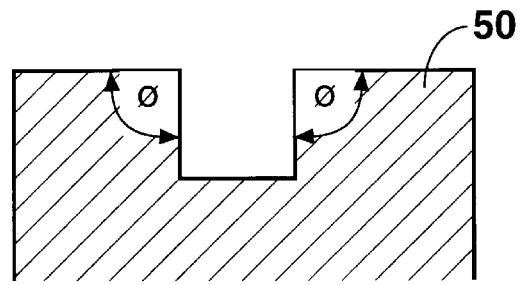

For purposes of the invention, a convex corner is a corner having an interior angle less than 180° measured between the edge surfaces of the microstructure that meet to form the corner. For example, a suspended microstructure having a square-shaped released portion (viewed from a point above the released portion) will include two convex corners; the interior angle between the edge surfaces of the released portion that form the corner will be 90° (i.e., less than 180°). Additional examples of convex corners are labeled as ϕ in FIGS. 5c and 6a. In each of the three examples of convex corners in FIGS. 7a–7c, the microstructure 50 includes edge surfaces 52 and 54 that meet at an angle ϕ less than 180°. FIGS. 7d and 7e illustrates microstructures that have been modified to include convex corners by including a void in the microstructure. In the example FIG. 7d, a triangular portion of microstructure 50 has been left out to produce convex corners ϕ (<180°) along the edge surface of the microstructure. Similarly, the example of FIG. 7e illustrates a microstructure 50 having a rectangular void which results in convex corners ϕ along the edge surface of the microstructure.

As shown by the above descriptions of rigid beam and flexible beam drying modes, the area at which inside menisci first form is a starting point for the evaporation of rinse liquid. The evaporation of rinse liquid from the microstructure's substantially displaceable regions toward rigid base regions is initiated by promoting the initial formation of inside menisci at the substantially displaceable regions. By initiating evaporation of rinse liquid at the regions of substantial possible displacement, evaporation of the rinse liquid away from these regions and toward the microstructure base portions (rigid beam drying) will occur and the substantially displaceable regions will not be drawn toward and adhere to the substrate as the liquid evaporates (bending beam drying).

Figures 8A, 8B, 8C, 8D:
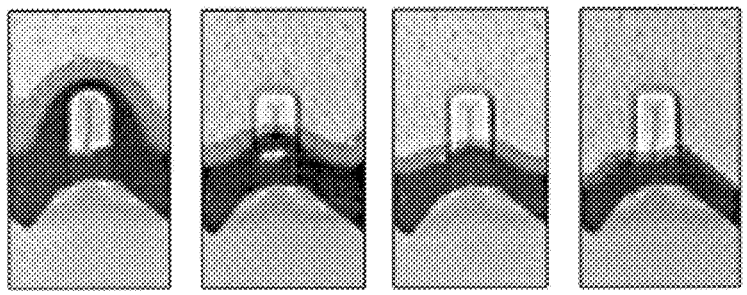
FIGS. 8a–8d are a series of time-lapse photomicrographs showing the rigid beam drying mode for a 72 μm-long cantilevered beam rinsed in deionized water and dried at room temperature.
Figures 8E, 8F, 8G, 8H:
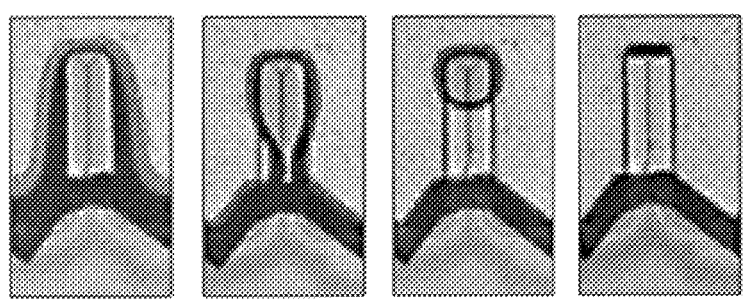
FIG. 8e–8h are a series of time-lapse photomicrographs showing the bending beam drying mode for a 138 μm-long cantilevered beam rinsed in deionized water and dried at room temperature.

Photomicrographs taken by the inventors of two micromachined beams of different lengths (FIGS. 8a–8d and FIGS. 8e–8h) corroborate the rigid beam and bending beam drying modes described above for micromachined cantilevered beams rinsed in deionized water and dried at room temperature. In FIGS. 8a–8d, the liquid dries from the tip to the base of a short (72 μm), and therefore relatively rigid, micromachined cantilevered beam. This rigid beam drying process produced a completely released microstructure without stiction. FIGS. 8e–8h show the drying process for a longer (138 μm), and therefore less rigid, micromachined cantilevered beam. Narrow necking of the rinse liquid occurred near the beam base and, with time, a disconnected droplet formed under the beam tip. The drying of the disconnected droplet proceeded toward the beam tip, opposite the drying direction for the shorter, more rigid, beam (FIGS. 8a–8d). FIG. 8h shows that the beam tip has adhered to the substrate, either because of a small amount of rinse liquid remaining at the beam tip or through a solid bridge formed at the tip during the drying process. It was determined that long beams (and consequently, flexible beams) exhibiting the base-to-tip form of drying permanently adhered to the substrate.

Shaping suspended microstructures to include additional convex corners at regions on the released portion of the microstructure which can undergo substantial displacement toward the substrate will inhibit stiction. Structures that include convex corners are therefore referred to herein as "anti-stiction" structures. For example, incorporating a structure that includes additional convex corners on the edge surfaces of the tip region of cantilevered beams or on the edge surfaces of the center region of doubly-clamped beams inhibits stiction of the microstructures. The presence of additional convex corners on the tip region of a cantilevered beam has been experimentally shown to promote the transition of the rinse liquid from an outside meniscus to an inside meniscus at the beam tip and initiates the rigid beam drying mode wherein the rinse liquid dries from the tip to the base of the beam. The incorporation of the additional convex corners near the center of a doubly clamped beam initiates the formation of inside menisci on either side of the beam at the beam center, thereby initiating a rigid beam-type drying mode wherein the rinse liquid dries from the center region to the base regions of the beams. In both cases, the initiation of drying towards the microstructures' one or more bases prevents isolated droplets from forming at regions of substantial possible displacement toward the substrate, and prevents the microstructure from being drawn into contact or close proximity with the substrate as the isolated droplet evaporates (bending beam drying mode). The additional convex corners can also be formed by creating voids in the released portion of the microstructure, such as the convex corners in FIGS. 7d and 7e. Also, when the released portion of a microstructure is either relatively long or covers a relatively large area, two or more of anti-stiction structures or voids may be required to prevent stiction of the released portion.

The inventors have also determined that for microstructures with relatively long released portions, the consequent flexibility of the released portions may negate the inside-meniscus-inducing affect of additional convex corners. Such microstructures would dry by the bending beam mode despite the presence of additional corners. However, the inventors have found that the presence of additional convex corners at regions of substantial possible displacement still inhibit adhesion of the released portions; it is believed that the additional convex corners reduce the area of possible contact between substrate and the region of the microstructure including the additional corners, and thereby reduces the magnitude of the forces urging the microstructure toward the substrate.

To test for inhibition of stiction, micromachined cantilevered and doubly clamped beams were patterned and fabricated to include additional structures having convex corners at positions on the microstructures which can undergo substantial possible displacement toward the substrate. The release yield was then measured and compared to conventionally shaped microstructures not including the additional convex corners.

EXAMPLE 1

SiO$_2$ Cantilevered Beams with KOH Etch

Thermally grown SiO$_2$ cantilevered beams, 1.4 μm thick and 70 μm wide, were patterned into seven different lengths from 150 to 330 μm using aqueous hydrofluoric acid. Three types of structures measuring 10 μm long×10 μm wide, 10 μm long×30 μm wide, and 10 μm long×50 μm wide, respectively, were patterned on the beam tips during masking. The general shape of the masking patterns of the released portions of the beams are illustrated in FIGS. 9a–9c. Beams with no extra structures were also patterned as controls. The (100) silicon wafer substrate was then etched for 35 minutes in 25% aqueous potassium hydroxide solution at 80° C., resulting in a 35 μm deep cavity. By orienting the long dimension of the cantilevered structures at a 45° angle from the (110) plane, the microstructures were completely undercut by the potassium hydroxide etch. The samples were rinsed in deionized water for 5 minutes after the potassium hydroxide etch.

Figure 10:
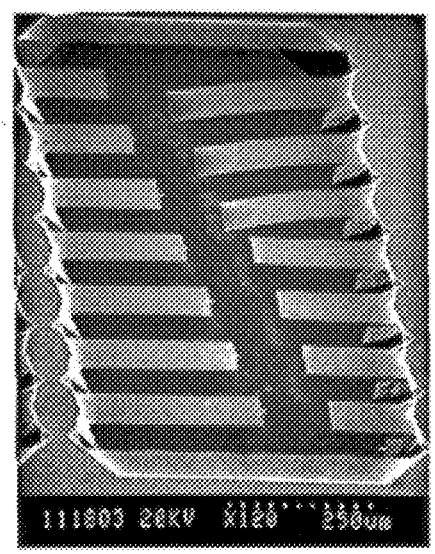
FIG. 10 is an SEM photograph of two sets of bulk micromachined cantilevered beams fabricated by the process described in Example 1 and either lacking the anti-stiction structures of the present invention or including one of three experimental anti-stiction structures.

FIG. 10 is a scanning electron microscope photograph of two sets of the 83 sets of cantilevered beams fabricated by the process of Example 1. Each set included 14 cantilevered beams. Of the four vertical columns of beams shown in FIG. 10, the beams in the rightmost column are the control beams, while the beams in the remaining columns include anti-stiction structures, with the leftmost column including the largest (10 μm long×50 μm wide masked shape) structures and the column adjacent the control beam column including the smallest (10 μm long×10 μm wide masked shape) structures. It will be appreciated from considering FIG. 10 that the etching process resulted in anti-stiction structures of different shapes than the original masked shapes. For example, the anti-stiction structures masked as 10 μm×10 μm etched to triangular shapes having one convex corner and had final width and length dimensions no greater than 10 μm. FIG. 11 plots release yield (% of the total number of micromachined beams which were released from the substrate) as a function of beam length for the 83 sets of 14 micromachined beams of varying length, with or without the added anti-stiction structures of varying sizes. Virtually no stiction was observed in the beams with the smallest anti-stiction structures, while the stiction behaviors of the beams with the larger anti-stiction structures were virtually identical to the control beam behavior.

FIG. 11 also shows that beams without the smallest anti-stiction structures (10 μm×10 μm masked shape) show increasing yields when the beam length exceeds 270 μm. It is believed that the inhibition of stiction at beam lengths in excess of 270 μm occurred because physical contact between the longer beams and the substrate during drying produced an "S"-shaped bending of the beams rather than a simple bending, and the "S"-shaped bending generates a larger restoring force, decreasing stiction.

It is believed that the addition of the smallest anti-stiction structures (10μ×10μ masked shape) promoted the stiction-inhibiting rigid beam drying mode wherein rinse liquid dried from beam tip to beam base. However, observation of the drying process in an optical microscope revealed that very long cantilevered beams (i.e., beams having lengths sufficient to form the above-discussed "S"-shaped configuration during drying) still exhibited the stiction-promoting bending beam drying mode (wherein isolated droplets formed at the beam tips) even when shaped to include the smallest added structures. The maximum possible vertical displacements of the very long beams' tips are so large in the bulk micromachined samples that the additional convex cornered anti-stiction structures would not alter the drying mode. In these cases, it is believed that the anti-stiction structures did not prevent stiction by initiating the rigid beam drying mode, but rather by reducing the area of contact between the tips of the microstructures and the substrate.

EXAMPLE 2

Polysilicon Doubly Clamped Beams With Sacrificial Etch

A 1.7 μm thick film of amorphous silicon was sputtered on a silicon wafer with a 1.4 μm thick thermally grown $SiO_2$ layer. The film was crystallized with a 2 hour anneal at 700° C. in nitrogen. After the anneal, the temperature was increased to 1000° C. and wet oxygen was introduced to form a 3500 Å $SiO_2$ layer. After patterning the surface $SiO_2$ with an aqueous hydrofluoric acid solution to provide for doubly clamped beams with and without anti-stiction structures, the polysilicon layer was etched in $HNO_3$:$HF$:$H_2O$ (50:1:20) for 2.6 minutes. The 1.4 μm thick sacrificial $SiO_2$ layer was then etched in a buffered hydrofluoric acid solution for 2 hours to release the doubly clamped beams. The dimensions of the resulting micromachined doubly clamped beams were 170 μm long×30 μm wide×1.35 μm thick, and had a gap distance between the beams and the substrate of 1.4 μm. When the release etch was completed, the wafer was rinsed in deionized water for 5 minutes and dried at room temperature.

Figure 12:
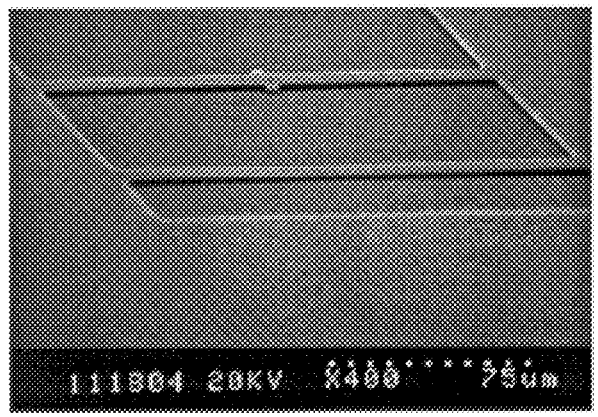
FIG. 12 is an SEM photograph of two surface micromachined doubly-clamped beams fabricated by the process described in Example 2, the bottom beam including two anti-stiction structures having masked dimensions of 10 μm×10 μm.

FIG. 12 shows an SEM photograph of the two bridges. The lower bridge was patterned to include two 10 μm×10 m anti-stiction structures in the center of the beam (where the beam could undergo maximum displacement in the direction of the substrate) and was completely released from the substrate after the rinse liquid dried. The plain beam without the anti-stiction structures permanently adhered to the substrate after drying. Example 2 confirms that the anti-stiction structures of the present invention may be successfully used to inhibit stiction regardless of the suspended microstructure fabrication technique used.

The following prophetic Examples 3–10 illustrate possible shape modifications to conventionally-shaped microstructures so as to include additional convex corners at positions which can undergo substantial displacement toward the substrate. The modifications may be in the form of additional structures (as in Examples 1 and 2) or may be in the form of voids which create convex corners.

EXAMPLE 3

Figure 13A:
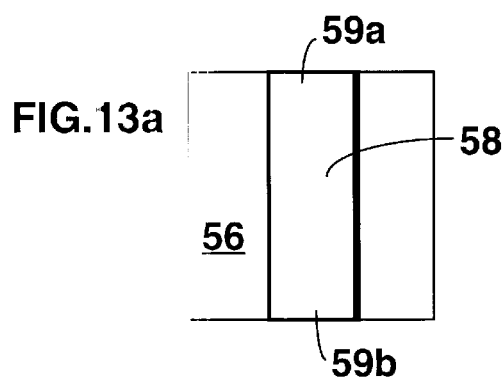
FIGS. 13a–20b illustrate possible modifications to the edge surfaces of microstructures to create the convex corners of the present invention.
Figure 13B:
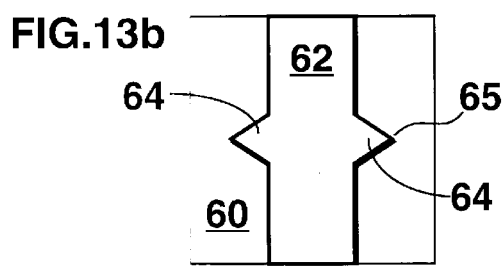
Figure 13C:
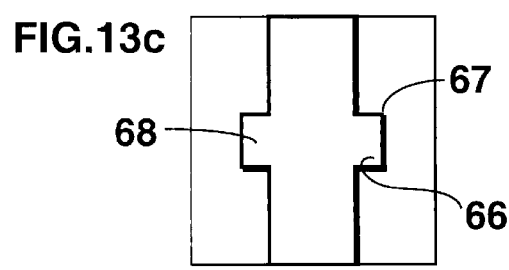
Figure 13D:
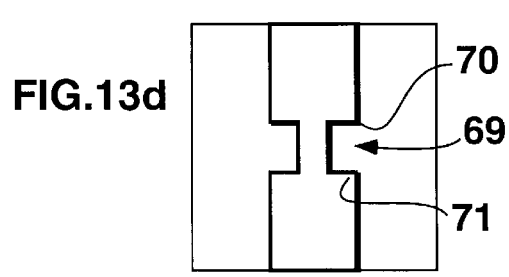

FIG. 13a illustrates a doubly clamped beam microstructure of conventional design having released portion 58 suspended above substrate 56 by base portions 59a and 59b. FIGS. 13b–13d depict possible microstructure designs modified to include additional convex corners at the center region of the beam's released portion. FIG. 13b includes released portion 62, suspended above substrate 60, that includes triangular structures 64 along both edge surfaces of the released portion. Convex corner 65 of structure 64 would initiate an inside meniscus in the center region of the released portion and drying of rinse liquid would proceed toward the two base regions. FIG. 13c includes alternate rectilinear anti-stiction structures 68 having convex corners 66 and 67, while the released portion of FIG. 13d includes rectilinear void 69 and thereby creates convex corners 70 and 71. Depending on the length of the released portion, the convex corners produced by structures 64, 66 and void 69 may either (i) initiate the formation of inside menisci and produce short-beam-type drying or (ii) may reduce the area of possible contact between the beam and the substrate and minimize forces urging the beam toward the substrate. In either case, the shape modifications will inhibit stiction.

EXAMPLE 4

Figure 14A:
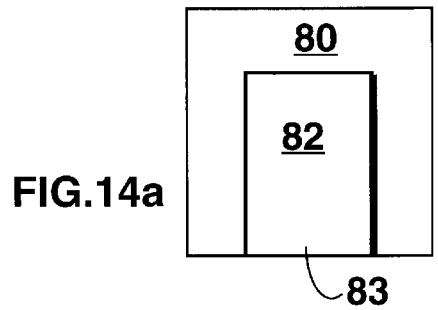
Figure 14B:
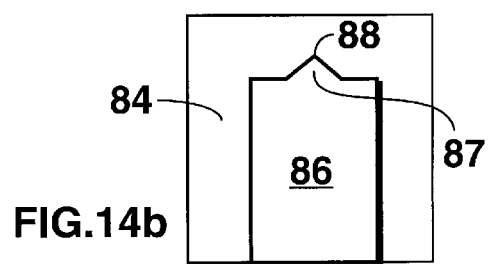
Figure 14C:
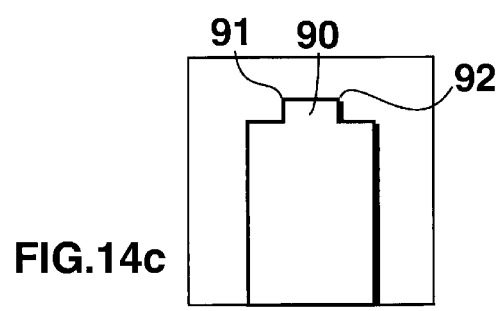
Figure 14D:
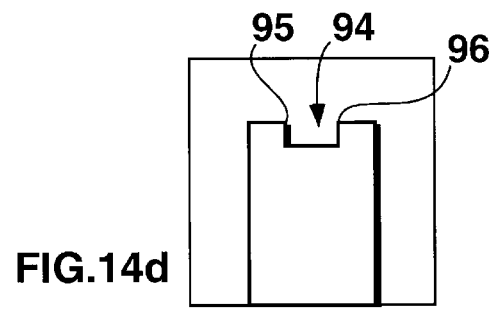
Figure 15A:
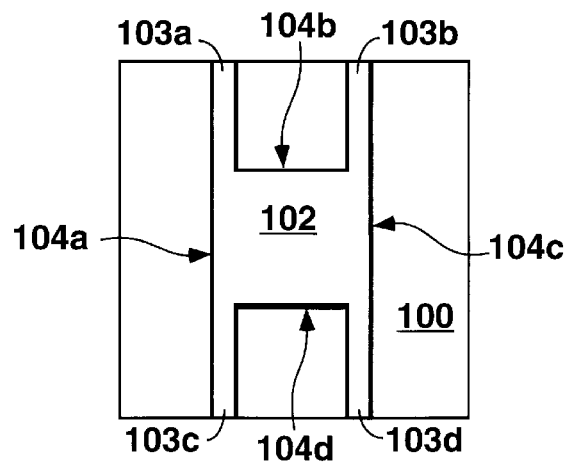
Figure 15B:
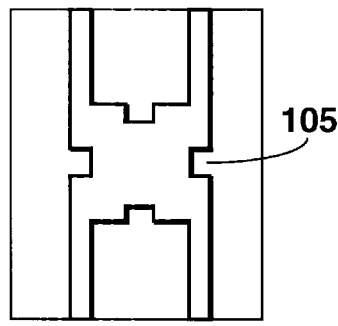
Figure 15C:
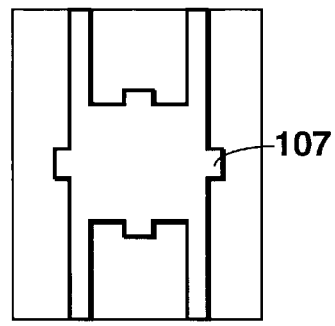
Figure 15D:
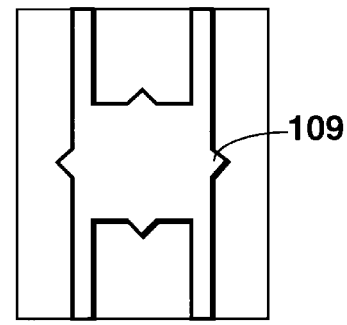

FIG. 14a depicts a conventionally-shaped cantilevered beam having released portion 82 suspended above substrate 80 by base portion 83. FIG. 14b depicts released portion 86, suspended above substrate 84, which has been modified to include triangular-shaped anti-stiction structure 87 having convex corner 88 on the edge surface of the tip region of the released portion. As possible alternatives designs, FIGS. 14c and 14d depict rectangular anti-stiction structure 90 having convex corners 91 and 92, and void 94 providing convex corners 95 and 96.

EXAMPLE 5

FIG. 15 illustrates a conventionally-shaped multiply-clamped microstructure including released plate portion 102 suspended above substrate 100 by base portions 103a–103d. The plate portion includes edge surfaces 104a–104d. FIGS. 15b–15d illustrate three possible shape modifications 105, 107 and 109 disposed on the edge surfaces of regions of the plate portion which can undergo substantial displacement toward the substrate when influenced by the surface tension and Laplace forces created by rinse liquid trapped between the plate portion and the substrate.

EXAMPLE 6

Figure 16A:
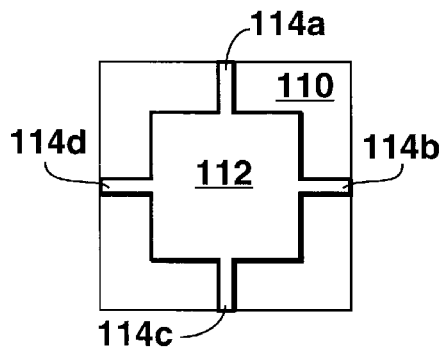
Figure 16B:
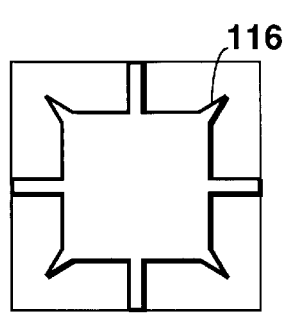
Figure 16C:
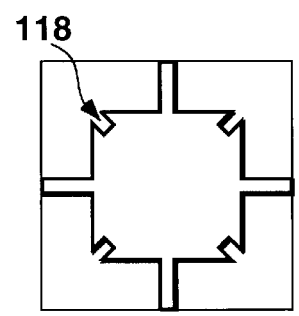
Figure 17A:
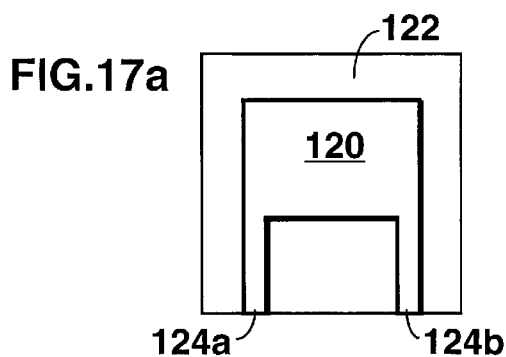
Figure 17C:
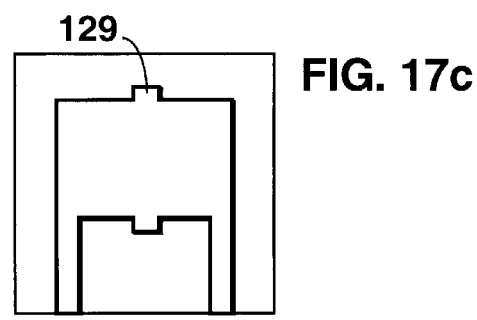
Figure 17B:
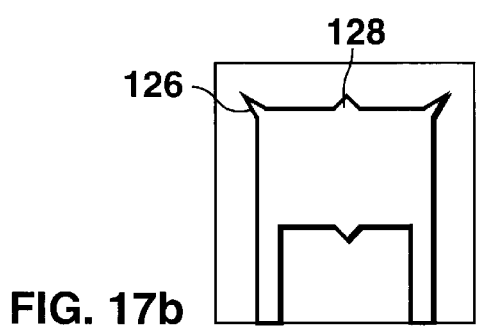
Figure 17D:
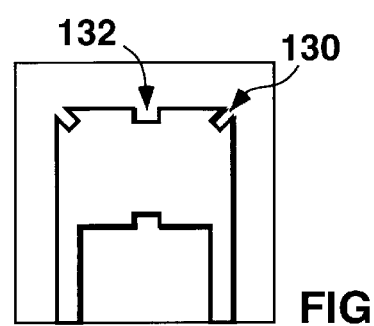

FIG. 16 shows a microstructure including plate portion 112 suspended above substrate 110 by base portions 114a–114d. The base portions 114a–114d are connected to the plate portion 112 by portions of the microstructure emanating from the center of the plate portion's edge surfaces. FIGS. 16a and 16b, respectively, provide stiction-inhibiting designs including anti-stiction structure 116 and anti-stiction void 118. Although these Examples and each of the previous individual Examples incorporate anti-stiction structures or voids of uniform design, a mix of structures or voids producing convex corners could be used.

EXAMPLE 7

FIG. 17 depicts a doubly-supported plate of conventional design having plate portion 120 suspended above substrate 122 by base portions 124a and 124b. FIGS. 17b and 17c provide alternate stiction-inhibiting designs including anti-stiction structures 126, 128 and 129. Alternate embodiment 18d includes voids 130 and 132 that produce numerous convex corners.

EXAMPLE 8

Figure 18A:
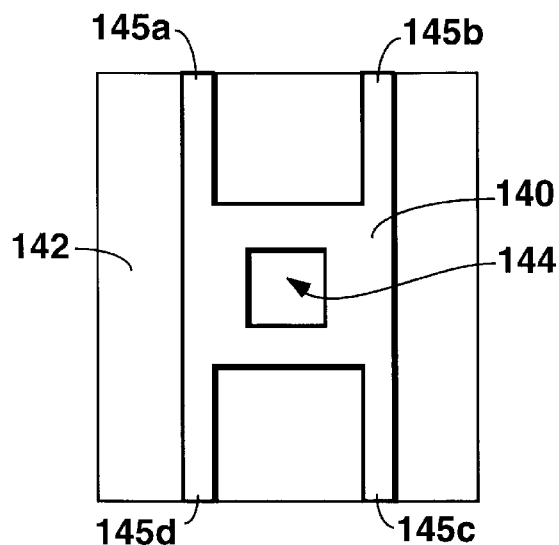
Figure 18B:
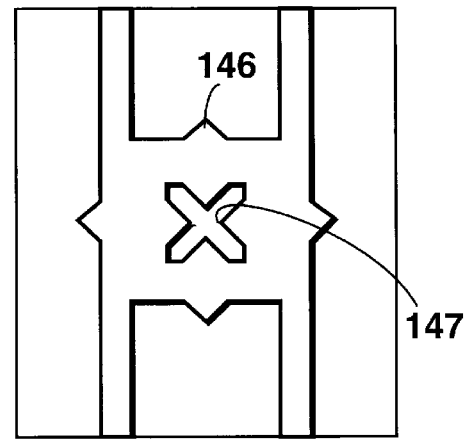
Figure 18C:
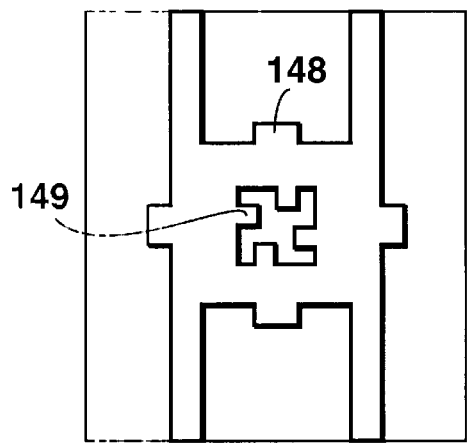
Figure 18D:
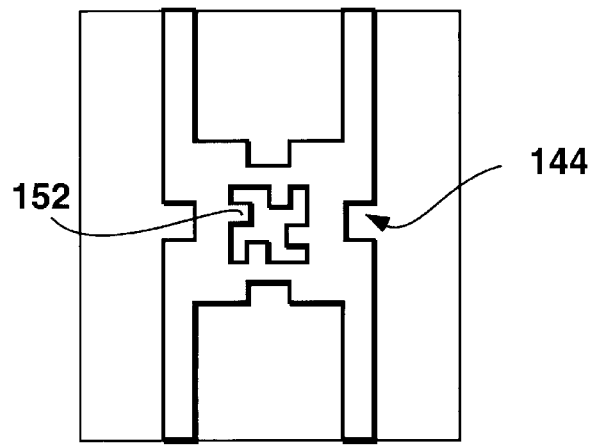
Figure 19A:
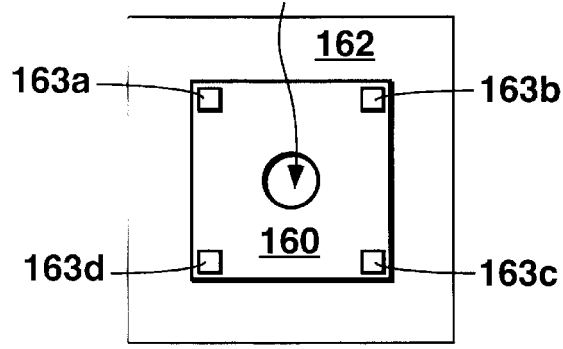
Figure 19B:
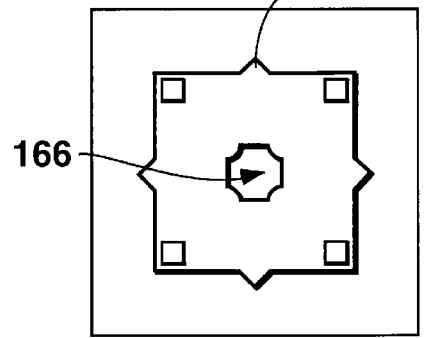
Figure 19C:
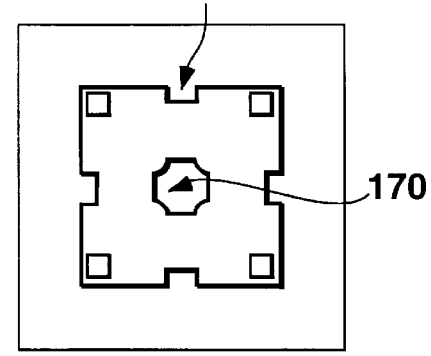
Figure 19D:
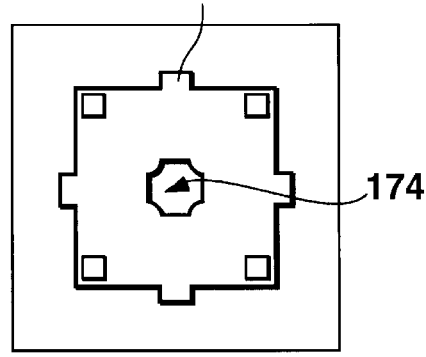

FIG. 18a depicts a conventional suspended microstructure including plate portion 140 having square void 144 therein and suspended above substrate 142 by base portions 145a–145d. FIGS. 18d–18d provide alternate stiction-inhibiting designs. Anti-stiction structures 146 and 148, and void 150 are incorporated on the outside edge surfaces of the suspended plate portion. In addition, in each of Examples 15b–15d, anti-stiction structures 147, 149 and 152 have been added to the edge surfaces of the void in the center of the plate portion.

EXAMPLE 9

FIG. 19 illustrates a microstructure of conventional shape composed of plate portion 160, including circular void 164, suspended above substrate 162 by posts 163a–163d. The microstructures of FIGS. 19b–19d are modified to prevent stiction and include outer edge modifications 168 (pointed structure), 169 (rectangular void) and 172 (rectangular structure) on the outer edge surfaces of the plate portion. The anti-stiction embodiments also include identical shape modifications 166, 170 and 174 to the circular void to create additional convex corners at the center of the plate, a region which would undergo substantial displacement toward the substrate.

EXAMPLE 10

Figure 20A:
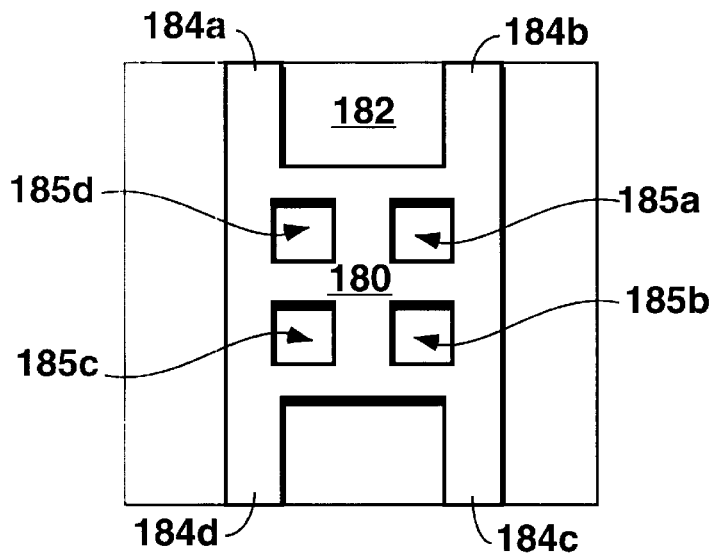
Figure 20B:
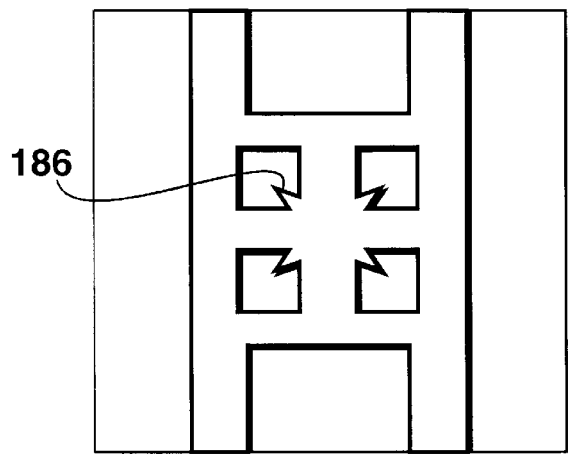

FIG. 20a depicts a somewhat more complex microstructure including released portion 180, having four square voids 185a–185d therein, suspended above substrate 182 by base portions 184a–184d. FIG. 20b provides a simple stiction-inhibiting modification wherein pointed structures 186 are disposed at the corners of the square voids at a point close to the center of the released portion, a region which would undergo substantial displacement toward the substrate by the forces exerted by rinse liquid disposed between the microstructure and the substrate.

II. Stiction Reduction By Substrate/Microstructure Clefts

The inventors have also discovered that shaping the field region so as to define one or more clefts between the released portion of the microstructure and adjacent field regions can prevent the withdrawal of rinse liquids near the microstructure's one or more base region, and thereby prevent the rinse liquid from drying by the bending beam drying mode. The clefts should be incorporated at regions of the released portion of the microstructure which are relatively rigid and cannot undergo substantial displacement in the direction of the substrate, preferably at one or more of the microstructure's base portions. It has also been found that the substrate defining the cleft should not have been substantially undercut during etching.

It is believed that the incorporation of clefts near the relatively rigid regions of the released portions prevents the rinse liquid from moving under the released portion and pinching off at those regions. If undercutting of the substrate is substantial, the desired effect is not achieved. By preventing the rinse liquid from pinching off at the relatively rigid regions, the formation of isolated droplets of rinse liquid at the released portion's substantially displaceable regions is also prevented. It will be understood from the above discussion that preventing the formation of isolated droplets of rinse liquid at substantially displaceable regions (as defined above) will prevent those regions from becoming adhered to the substrate.

Figure 21:
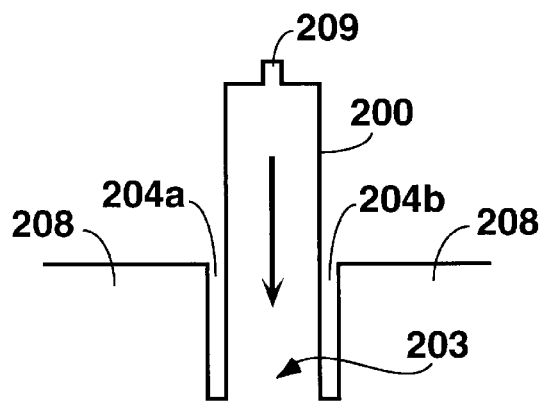
FIG. 21 is a representation of a cantilevered beam including an anti-stiction structure and the substrate/microstructure clefts of the present invention.

As an example, in bulk micromachined cantilevered beam 200 shown in FIG. 21, two clefts 204a and 204b (defined by the edge of the suspended portion of the microstructure and by the adjacent substrate material 208) have been added by modifying the microstructure fabrication process. The clefts 204a and 204b include portions adjacent the relatively rigid base portion 203 of the microstructure. Clefts 204a and 204b act to prevent rinse liquid from moving underneath the suspended portion of the microstructure 200 at or near the base portion 203 of the microstructure 200. Therefore, a pinched off rinse liquid droplet cannot form at the tip region of the microstructure 200 (as would occur in a bending beam drying mode) and, instead, rinse liquid dries in the direction of the arrow by a stiction-inhibiting rigid beam drying mode.

The portion of the substrate defining clefts 204a and 204b of FIG. 21 extends beyond the rigid base portion 203 to a relatively non-rigid region of the suspended portion of microstructure 200. In such a configuration, the width of that portion of clefts 204a and 204b at the relatively rigid regions should be no greater than the width of any other portion of the clefts. As examples of this principle, in Examples 1–5 below the anti-stiction substrate/microstructure clefts taper to a point in the direction of the microstructure base portion. Tapering is especially useful in situations were undercutting is unavoidable. However, it is to be understood that a cleft configuration tapering to a point is only one of the possible substrate/microstructure cleft shapes which satisfies the foregoing principle. The cleft shape provided in FIG. 21 is another example.

The cantilever beam of FIG. 21 also includes anti-stiction structure 209 on the edge surface of the tip region of the beam. A single suspended microstructure, such as that depicted in FIG. 21, can incorporate both (i) the convex corner invention described above and (ii) the substrate/microstructure cleft invention to inhibit adherence of the released portion of the microstructure. However, it is to be understood that either of the inventions can be employed singly, without the other invention, to successfully prevent stiction. Additional prophetic examples of the present substrate/microstructure cleft invention are provided in Examples 1–5 below.

EXAMPLE 1

Figure 22A:
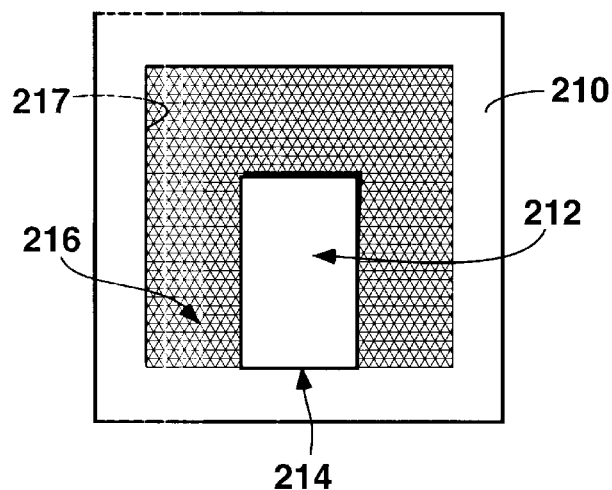
FIGS. 22a–26b illustrate possible stiction-inhibiting modifications to the field regions of the substrate of suspended microstructures so as to include substrate/microstructure clefts.
Figure 22B:
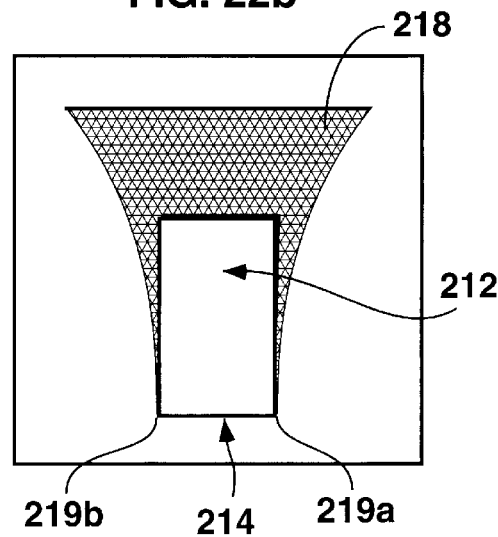

FIG. 22a depicts a cantilever beam suspended microstructure wherein 210 is the substrate (typically silicon), 212 and 214, respectively, are the base portion and released portion of the microstructure, and dark-shaded region 216 represents the etched region beneath the released portion 212 (i.e., an air space between the released portion and the substrate). Thus, etched region 216 will be bounded by interior edge surface 217 having a certain measurable depth, albeit very small. FIG. 22b illustrates a reduced-stiction alternative design to that of FIG. 22a, wherein a differently-shaped etched region 218 provides substrate/microstructure clefts 219a and 219b at the base region 214. The edge surfaces of cleft 219a and 219b are defined by the edge surface of the etched region 218 and the edge surface of the relatively rigid region of the released portion 212 adjacent base region 214, which is attached to the substrate.

EXAMPLE 2

Figure 23A:
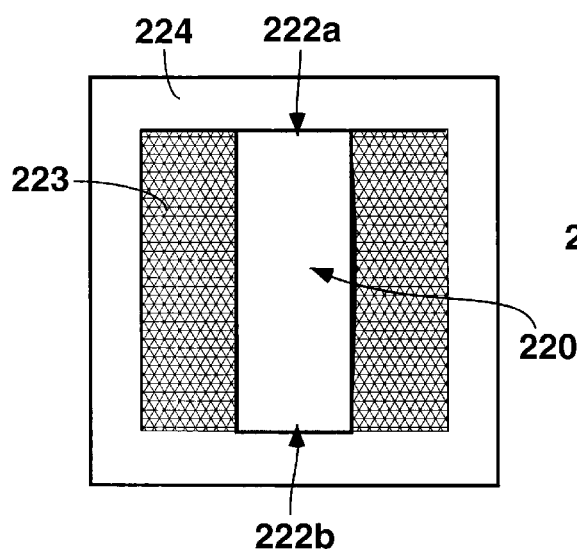
Figure 23B:
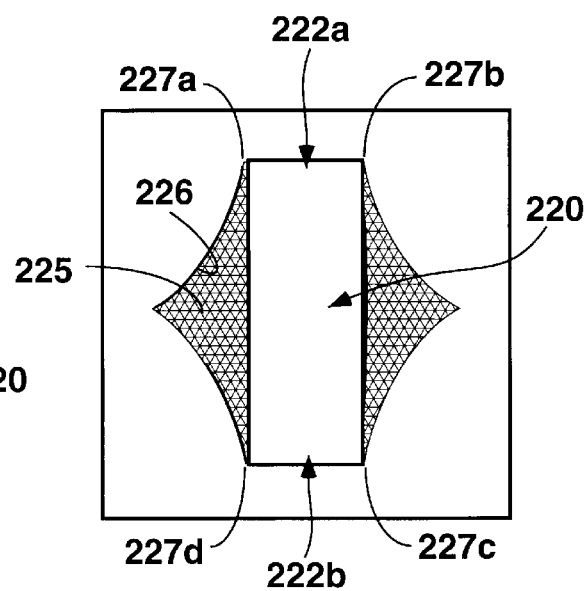

FIG. 23a depicts a doubly-clamped beam having base regions 222a and 222b, and released portion 220 suspended above etched region 223 etched in substrate 224. A reduced-stiction alternative embodiment is shown in FIG. 23b and includes etched region 225 having edge surface 226 which, along with the edge surfaces of the released portion 220, defines stiction-inhibiting substrate/microstructure clefts 227a–227d at the relatively rigid regions of the released portion 220, i.e., those regions adjacent base portion 222a and 222b.

EXAMPLE 3

Figure 24A:
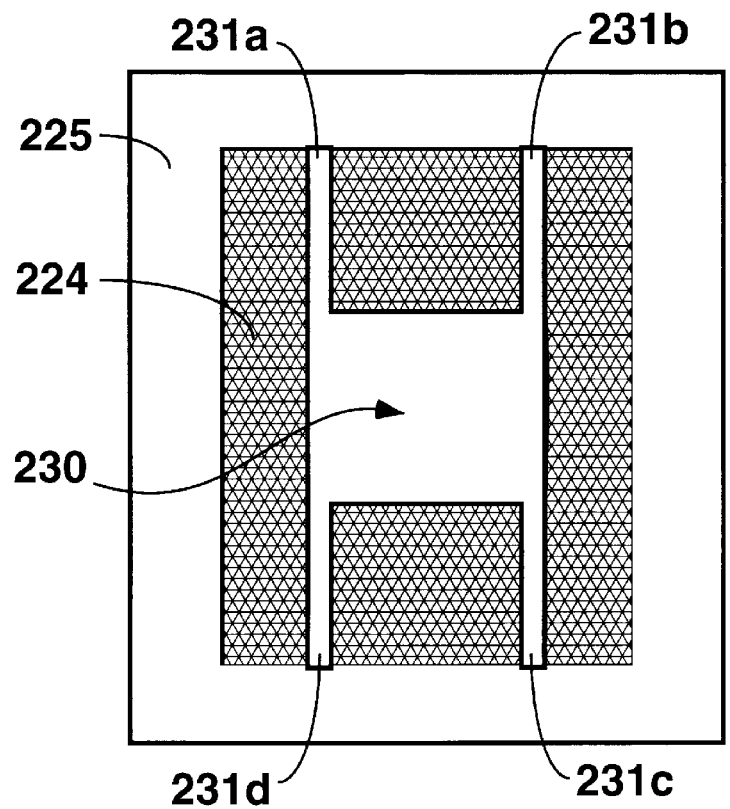
Figure 24B:
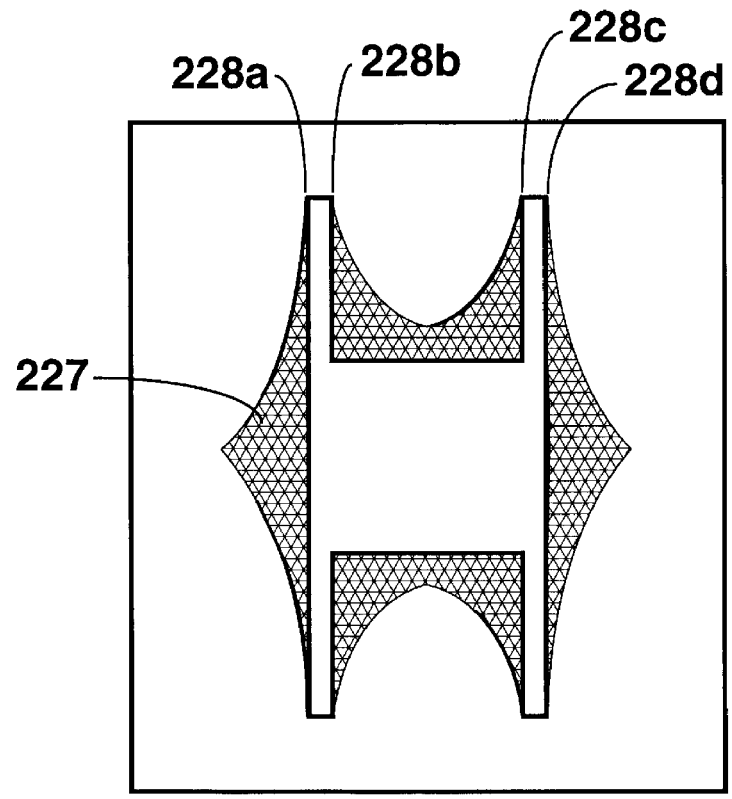

FIG. 24a depicts a multiply-clamped microstructure having four base portions 231a–231d and released portion 230 suspended above etched region 224 of substrate 225. A reduced stiction alternative embodiment shown in FIG. 24b includes uniquely-shaped etched region 227 which provides multiple substrate/microstructure clefts of the present invention (including those clefts labeled as 228a–228d) at the four relatively rigid regions adjacent the microstructure's four base portions.

EXAMPLES 4 and 5

Figure 25A:
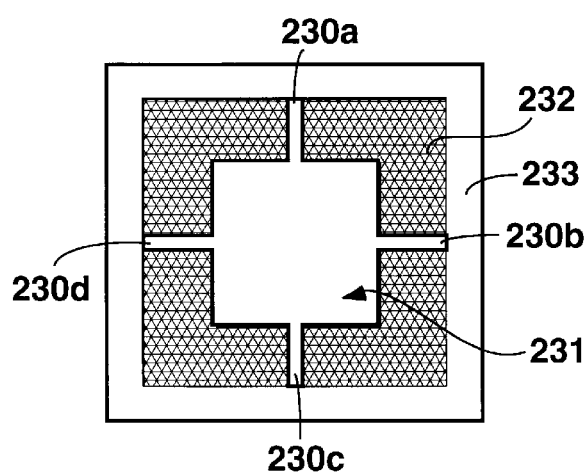
Figure 25B:
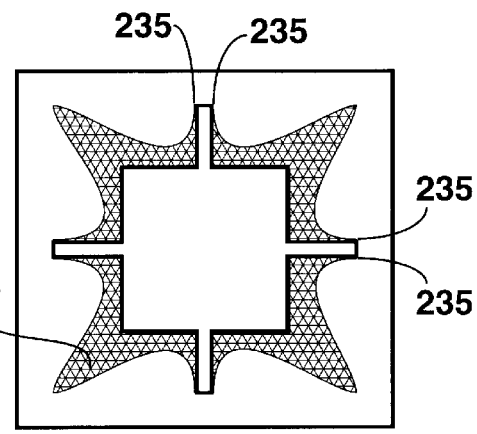
Figure 26A:
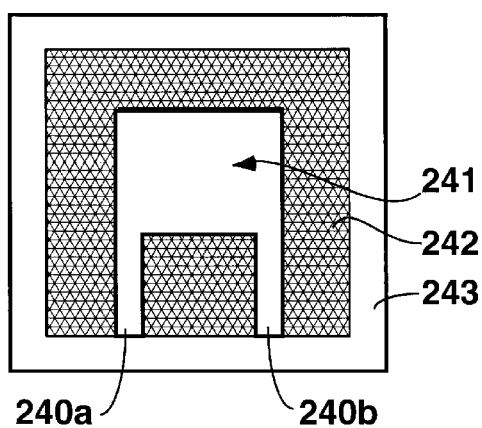
Figure 26B:
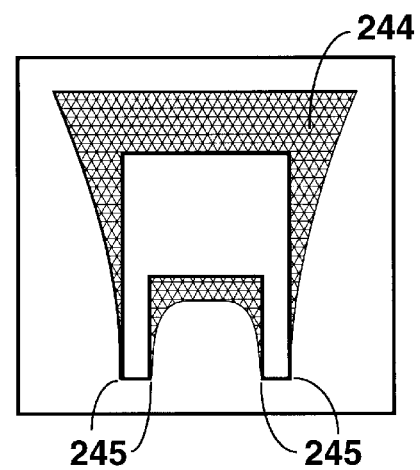

FIGS. 25a and 26a depict microstructures including base portions (230a–230d and 240a–240b) and released portions (231 and 241) suspended above a shaded etched region (232 and 242) of a substrate (233 and 243). Alternative, stiction-inhibiting designs for the microstructures depicted in FIGS. 25a and 26a are provided in FIGS. 25b and 26b, respectively, which include specially-shaped etched regions 234 and 244 providing numerous substrate/microstructure clefts (including those labeled as 235 and 245) at the relatively rigid regions of the released portions which are adjacent the microstructures' base portions.

III. Stiction Reduction With Elevated Temperature Processing

Figure 27:
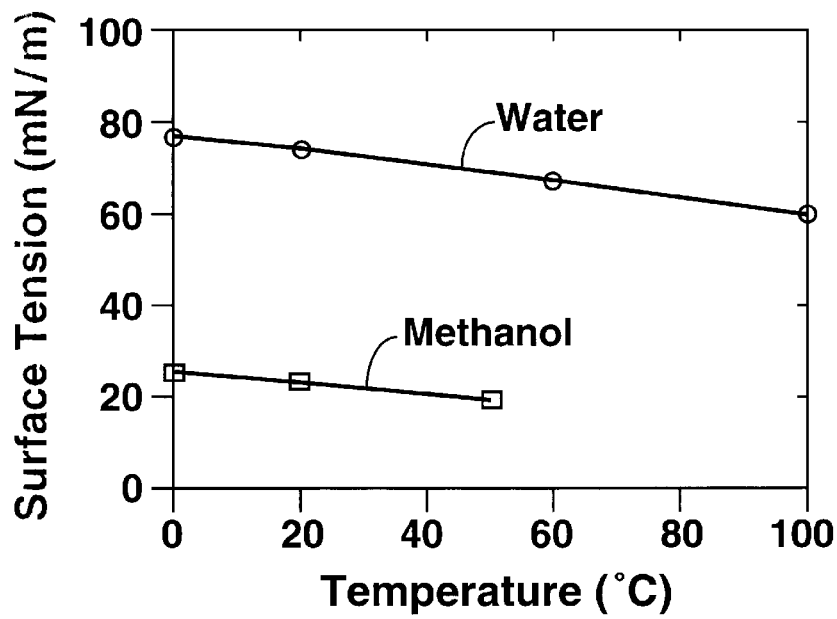
FIG. 27 is a plot of the surface tension of water and methanol as a function of temperature between 0° C. and the liquids' atmospheric pressure equilibrium boiling points

The bending of the released portion of suspended microstructures that results from trapped rinse liquids can be reduced by lowering the rinse liquid surface tension. FIG. 27 plots the surface tension of water and methanol, two possible etchant rinse liquids, as a function of temperature between 0° C. and the liquids' atmospheric pressure equilibrium boiling points. FIG. 27 shows that raising the temperature of the liquids only slightly decreases their surface tensions.

The inventors have found that conducting post-etch solvent rinse procedures at elevated temperatures significantly inhibits stiction of the released portion of suspended microstructures and can greatly increase microstructure release yields without additional complicated fabrication steps. However, because liquid surface tension is not strongly affected by increasing temperature (FIG. 27), only a slight increase in release yields would be expected if the drying process is performed at elevated temperatures. FIG. 4b, discussed above, also predicts that only a small reduction in vertical displacement of a cantilevered beam microstructure can be achieved by increasing rinse liquid temperature. Therefore, it is believed that the unexpected significant reduction in stiction using elevated temperatures is not solely due to reductions in surface tension. It is believed that the significant reduction in stiction will occur by the high-temperature methods of the present invention when any rinse liquid is used, including solvents such as, for example, water, methanol, ethanol, propanol and acetone. The inventors experimental data follows.

EXAMPLE 1

Effect of Elevated Rinse Liquid Temperature

To investigate the affects of elevated temperature rinses, several sets of micromachined cantilevered beams were fabricated by bulk micromachining techniques and microstructure release yields were calculated using different post-etch procedures. Thermally grown $SiO_2$ beams (1 $\mu$m thick× 44 $\mu$m wide) were patterned into eight different lengths ranging from 72 to 246 $\mu$m using aqueous hydrofluoric acid. The (100) silicon wafers were then etched for 30 minutes in 25% aqueous potassium hydroxide solution at 80° C. By orienting the long dimension of the cantilevered structures at a 45° angle from the (110) plane, they were completely undercut by the potassium hydroxide etch. The depth of the removed silicon cavity was 30 $\mu$m. After gentle rinsing in ambient temperature (20° C.) water for 15 minutes, several etched samples were soaked in either methanol or deionized ("DI") water for 20 minutes using post-release-etch procedures A through D in Table 1.

TABLE 1

| | Post-Release-Etch Procedures A–D | |
|---|---|---|
| | First Step | Second Step |
| A | 20° C. DI Water (15 minutes) | 20° C. DI Water (20 minutes) |
| B | 20° C. DI Water (15 minutes) | 20° C. Methanol (20 minutes) |
| C | 20° C. DI Water (15 minutes) | Boiling Water (20 minutes) |
| D | 20° C. DI Water (15 minutes) | Boiling Methanol (20 minutes) |

Figure 28:
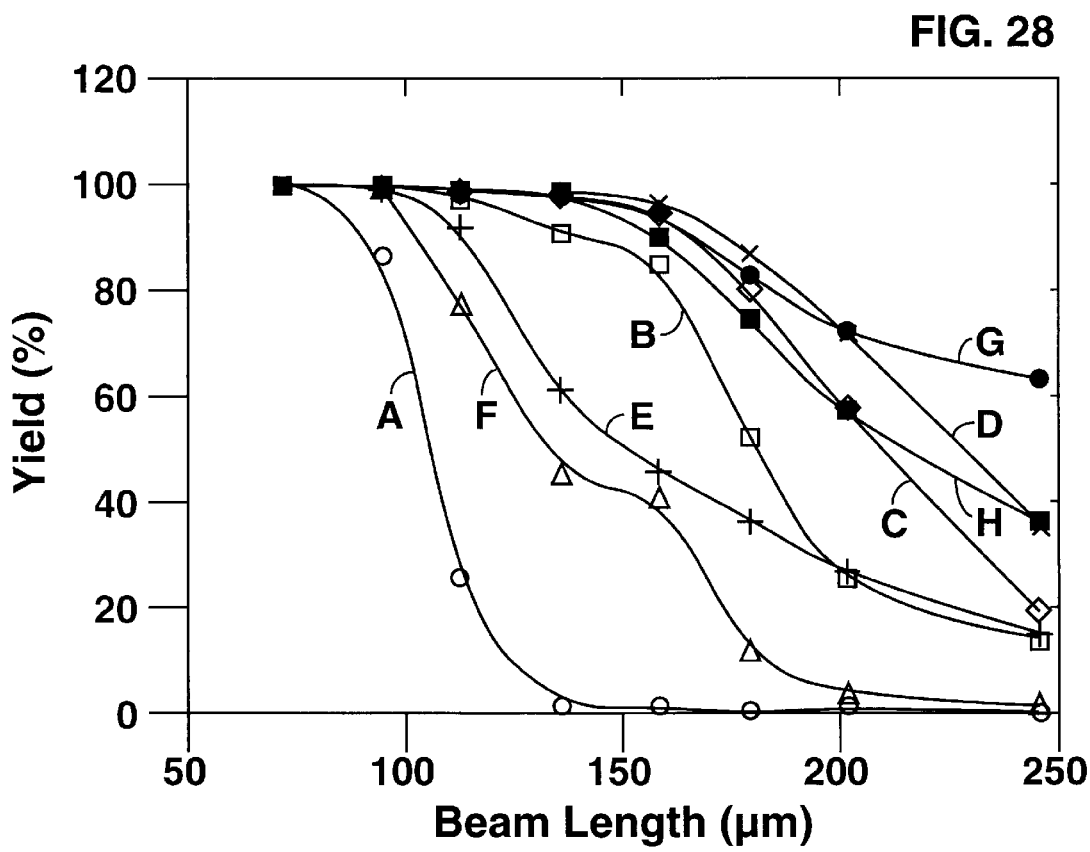
FIG. 28 is a plot of yield as a function of beam length using experimental rinsing and drying procedures A–H and including broken microstructures in the yield calculation.
Figure 29:
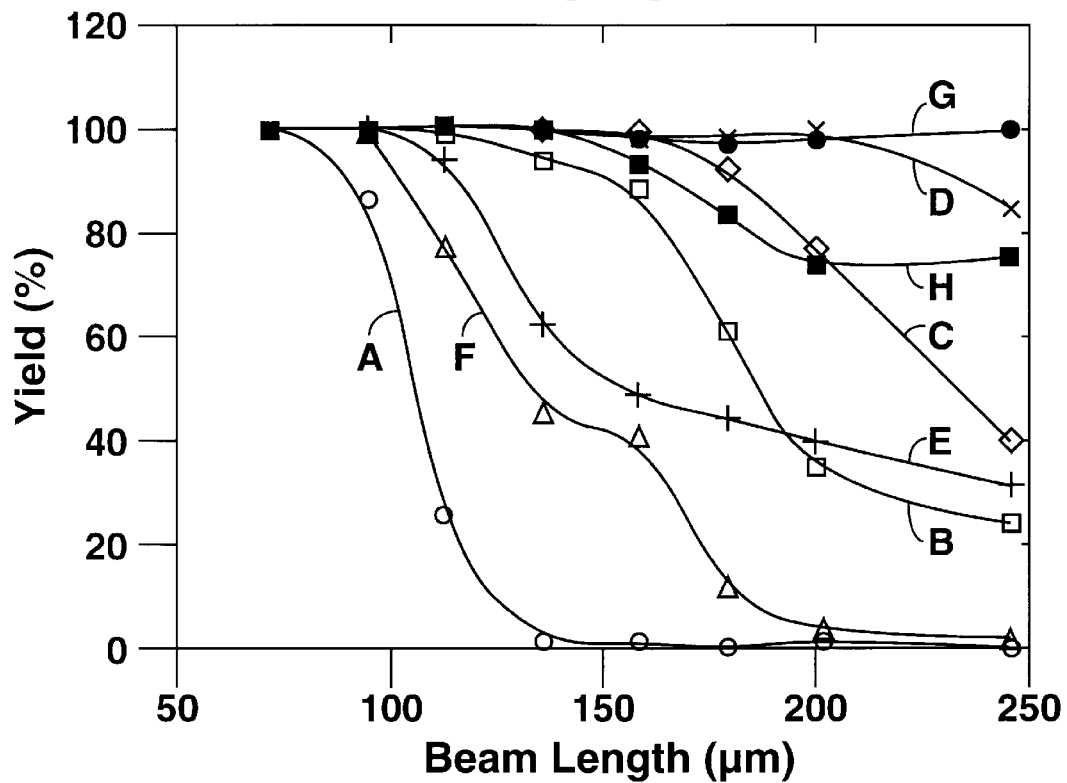
FIG. 29 is a plot of yield as a function of beam length using experimental rinsing and drying procedures A–H and excluding broken microstructures in the yield calculation.

More than 170 sets of samples were prepared by the bulk micromachining and post-release-etch rinsing processes above. The samples were then examined to calculate yield figures for each rinse procedure. Yields were calculated as the ratio of released microstructures to fabricated microstructures. Yields are plotted as a function of beam length in FIGS. 28 and 29 using rinsing procedures A–D. FIG. 28 plots yields calculated using all fabricated microstructures, including broken microstructures, while FIG. 29 plots yields calculated excluding broken microstructures. The Figures show that microstructure yield depended on the post-release-etch rinsing procedure used.

Figure 30:
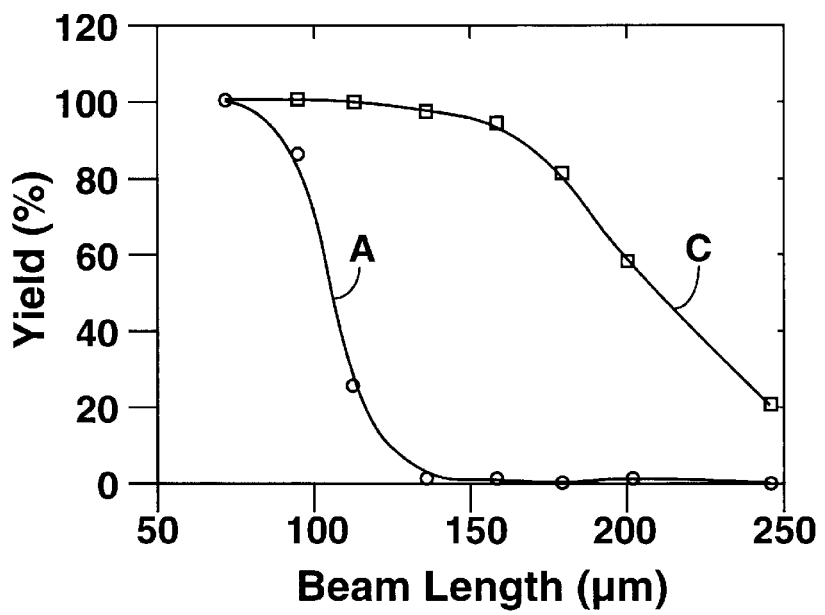
FIGS. 30 and 31 are plots of yield as a function of beam length for microstructures produced using experimental rinsing procedures A–D.
Figure 31:
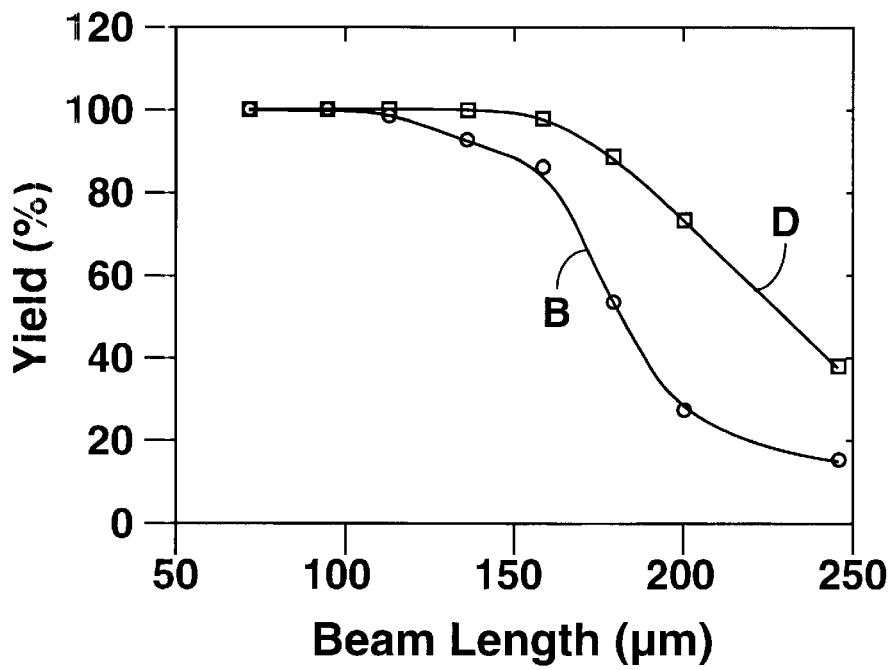

FIG. 30 plots the microstructure yield as a function of beam length after soaking in water at 20° C. and at its boiling point (procedures A and C, respectively), while FIG. 31 plots yield as a function of beam length after soaking in methanol at 20° C. and at its boiling point (procedures B and D, respectively). Whether the rinse liquid was water or methanol, elevated rinse liquid temperatures significantly increased microstructure yield. The yield increase is much greater than would be expected if the increased rinse temperature acted through reduction in liquid surface tension alone.

EXAMPLE 2

Effect of Increased Rinse Liquid Vaporization Rate

Additional experiments were performed to determine the stiction-inhibiting affect of a rapid increase in the rinse liquid vaporization rate. Cantilevered beams were patterned and etched in the manner outlined in Example 1. The various post-release-etch rinsing and drying procedures used for these experimental samples are summarized in Table 2 below.

TABLE 2

| | Post-Release-Etch Procedures A–D | | |
|---|---|---|---|
| | First Step | Second Step | Third Step |
| E | 20° C. DI Water (15 minutes) | Boiling Methanol (15 minutes) | 20° C. Methanol (5 minutes) |
| F | 20° C. DI Water (15 minutes) | 20° C. Methanol (15 minutes) | 20° C. Water (5 minutes) |
| G | 20° C. DI Water (15 minutes) | 20° C. Methanol (15 minutes) | 500° C. Rapid Anneal (10 seconds) |
| H | 20° C. DI Water (15 minutes) | 20° C. Water (15 minutes) | 500° C. Rapid Anneal (10 seconds) |

In drying procedure E (a high temperature methanol rinse in step 2 followed by a low temperature methanol rinse in step 3), the 20° C. methanol was slowly poured into the hot solvent without taking the samples out in order to avoid the partial drying which would occur if the samples were removed from the bath. A rapid thermal annealer ("RTA") was used to quickly heat the rinse liquid and accelerate the drying of the rinse liquid in drying procedures G and H. (The RTA was used only to expedite the heating process and it is believed that other means for heating the rinse liquid to accelerate the drying process nay be acceptable including, for example, furnace annealing.) Samples were removed from the rinse liquid and kept wetted as they were transferred to the RTA chamber, where the samples then underwent a 10 second anneal at 500° C. to thereby raise the temperature of the rinse liquid to above its critical point temperature.

The yield results of the procedures D–H are shown in FIGS. 28 (broken structures included) and 29 (broken structures excluded), along with the results of procedures A–B. A comparison of procedures A and F show that interspersing a methanol rinse between two water rinses reduces stiction, even though the final rinse steps in both procedures use water. However, a comparison of the yield by procedures B and E show that interspersing a boiling methanol rinse between 20° C. water and methanol rinses does not improve, and actually reduces, yield. This may indicate that the actual means of stiction inhibition does not involve removal of a solid residue.

Samples which were annealed in the RTA at 500° C. (procedures G and H) had enhanced yields compared with similar procedures (B and A) that did not use an anneal. If the increased rinse vaporization rate (of samples pulled from a boiling rinse) were not a factor in the improved yield, then one would not expect a significant difference using a high-temperature step. It is believed that the fact that the RTA treatment further reduces stiction indicates that rapid vaporization is a factor in reducing stiction, in addition to the reduced surface tension of the boiling rinses.

FIG. 28 masks an interesting point regarding the RTA-dried samples. The yields in FIG. 28 were calculated as the ratio of released microstructures to total fabricated structures. However, a significant portion of the "unreleased" microstructures in the RTA-dried samples (included in the denominator but not the numerator of the yield calculation for FIG. 28) consisted primarily of broken microstructures, rather than stuck beams. In FIG. 29, replotting yields to exclude any broken microstructures, the RTA drying of methanol-rinsed samples (procedure G) provided almost no stiction.

It is believed that microstructures may have broken during drying due to the metastability of the rinse liquid, which underwent violent vaporization once the gas phase forms. Trapped water bounded by a tight meniscus experiences considerable tension (i.e., absolute negative pressure), and the liquid phase is metastable at room temperature. The metastable state is mechanically unstable at elevated temperatures; any fluctuation, no matter how small, can drive the system into a new phase (i.e., vapor). It is also conceivable that the instability of a trapped droplet of rinse liquid is partly the cause of reduced stiction.

Figure 32:
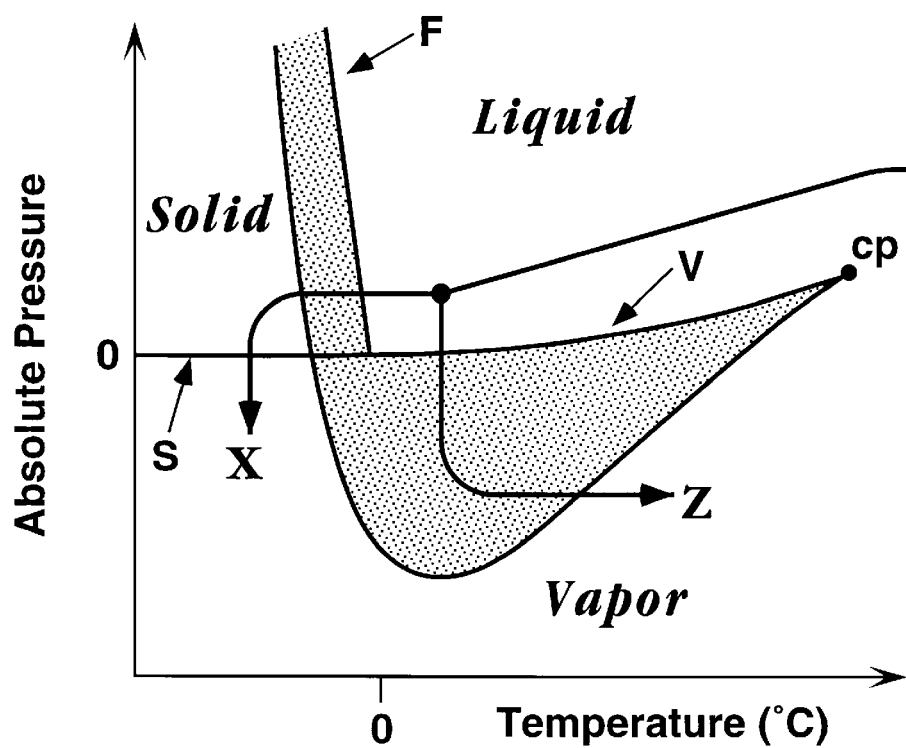
FIG. 32 illustrates the phase diagram of water (not drawn to scale) and including water's metastable regions.

According to the Laplace equation, the pressure difference across a meniscus increases as the radius of curvature decreases. It follows that the absolute pressure inside the liquid becomes negative when the radius reaches a critical value (for example, 1.45 $\mu$m for 20° C. water). This critical value is easily reached in micromechanical devices. Negative absolute liquid pressure is clearly impossible for liquids in equilibrium; lowering the pressure will vaporize the substance at some point. However, water and other liquids can exist in a metastable state under negative pressure, and can support considerable tensile forces while in that state. FIG. 32 illustrates the phase diagram of water (not drawn to scale) and its metastable regions. The heavy lines S, F and V, respectively, are the equilibrium sublimation, fusion and vaporization curves, and CP is the critical point. The light "U"-shaped curve represents the boundary of the shaded thermodynamically metastable region. Liquid water in the shaded metastable region is supercooled, superheated, or both. If the metastable boundaries are crossed, the fluid cavitates into a two phase system of liquid and vapor in an irreversible process. Also shown are phase trajectories X, Y and Z for various post-release-etch processes. Sublimation drying (trajectory X) and critical point drying (trajectory Y) avoid the negative pressure region by preventing the formation of small radii menisci altogether.

The inventors believe that the high-temperature rinse liquid drying process of the present invention, wherein the temperature of the rinse liquid is raised above its critical point temperature, is represented by trajectory Z. A small droplet forms at the tip of the micromachined cantilevered beam, forcing the end of the beam to stick to the substrate. Because the gap in a micromachined structure can easily attain submicron dimensions, it is conceivable that the radius of curvature is less than the critical value of 1.45 $\mu$m; the trapped water is thus under negative pressure. The high-temperature rinse liquid drying process of the present invention using the RTA forces the water from the metastable region into the vapor phase. The violent transition from a superheated to an equilibrium phase results in released, and often broken, microstructures.

The high temperature drying process did not release stuck structures when the sample was annealed after the drying process was completed at room temperature. This suggests that capillary forces are not the cause of permanent adhesion; if this were so, the liquid should vaporize when it is heated and release the beams.

What is claimed:

1. In a micromachining process for producing microstructures that include a base portion attached to a substrate, a released portion having top and bottom surfaces suspended above the substrate, and edge surfaces extending from the top surface to the bottom surface, a method for inhibiting adhesion between the released portion and the substrate during rinsing and drying, the method comprising the step of shaping the microstructure to include at least one convex corner along an edge surface of the microstructure at a region of the microstructure which can undergo substantial displacement toward the substrate.

2. The method recited in claim 1 wherein in said shaping step the configuration of said at least one convex corner promotes the drying of post-etch rinse liquid in a direction toward the base portion from a region on the released portion including said at least one convex corner.

3. The method recited in claim 2 wherein said at least one convex corner promotes the formation of an inside meniscus at said region on the released portion including said at least one convex corner.

4. The method recited in claim 1 wherein in said shaping step the shape of said at least one convex corner reduces the potential area of contact between the substrate and said region of the released portion including said at least one convex corner.

5. The method recited in claim 1 wherein the microstructure is a cantilevered beam and the released portion includes a tip region, and wherein said at least one convex corner is disposed along an edge surface of said tip region.

6. The method recited in claim 5 wherein a structure having one said convex corner is disposed along an edge surface of said tip region.

7. The method recited in claim 6 wherein said structure has a maximum width dimension less than 30 $\mu$m.

8. The method recited in claim 7 wherein said structure has a maximum width dimension no greater than about 10 $\mu$m.

9. The method recited in either of claims 7 or 8, and wherein said structure has a length dimension no greater than about 10 $\mu$m.

10. The method recited in claim 6 wherein the released portion of the cantilevered beam has a length dimension less than 330 $\mu$m and a width dimension of about 70 $\mu$m, and wherein said structure has a maximum width dimension less than 30 $\mu$m and a length dimension no greater than about 10 $\mu$m.

11. The method recited in claim 10 wherein said length dimension of said structure substantially extends in the direction of the longitudinal axis of the released portion of the cantilevered beam.

12. The method recited in claim 11 wherein the maximum width dimension of said structure is no greater than about 10 $\mu$m.

13. The method recited in claim 1 wherein the microstructure is a doubly-clamped beam having two base portions, and wherein said at least one convex corner is positioned intermediate the two base portions.

14. The method recited in claim 13 wherein said at least one convex corner is positioned in the center region of the released portion.

15. The method recited in claim 14 wherein at least one said convex corner is disposed along each edge surface of the released portion.

16. The method recited in claim 14 wherein a structure having two said convex corners is disposed along an edge surface of the center region of the released portion.

17. The method recited in claim 16 wherein said structure has a width dimension no greater than about 10 $\mu$m and a length dimension no greater than about 10 $\mu$m.

18. The method recited in claim 17 wherein said length dimension of said structure is measured along a line perpendicular to the longitudinal axis of the released portion.

19. The method recited in claim 17 wherein the released portion has a length dimension of about 170 $\mu$m and a width dimension of about 30 $\mu$m, and wherein two said structures are provided, one said structure disposed on each edge surface of the released portion.

20. The method recited in claim 1 wherein the microstructure includes at least three base portions.

21. In a micromachining process for producing a microstructure that includes a base portion attached to a substrate and a released portion suspended above the substrate, a method for inhibiting adhesion between the released portion and the substrate during rinsing and drying, the method comprising the step of etching the substrate to define a cleft between the substrate and the microstructure at a region of the microstructure which cannot undergo substantial displacement toward the substrate, and wherein in said etching step the portion of said substrate defining said cleft is not substantially undercut.

22. The method recited in claim 21 wherein said region of the microstructure is the base portion of the microstructure.

* * * * *